United States Patent
Brothers et al.

(10) Patent No.: US 10,004,949 B2
(45) Date of Patent: *Jun. 26, 2018

(54) MONITORING PERFORMANCE AND GENERATING FEEDBACK WITH ATHLETIC-PERFORMANCE MODELS

(71) Applicant: IAM Sports & Entertainment, Beverly Hills, CA (US)

(72) Inventors: Raymond Joseph Brothers, West Lake Village, CA (US); Eleftherios E. Gdoutos, Pasadena, CA (US); Adam Mulliken, Menlo Park, CA (US); John Pye, Phoenix, AZ (US)

(73) Assignee: IAM Sports & Entertainment, Agoura Hills, CA (US)

( * ) Notice: Subject to any disclaimer, the term of this patent is extended or adjusted under 35 U.S.C. 154(b) by 90 days.

This patent is subject to a terminal disclaimer.

(21) Appl. No.: 14/985,140

(22) Filed: Dec. 30, 2015

(65) Prior Publication Data

US 2017/0189757 A1    Jul. 6, 2017

(51) Int. Cl.
| | |
|---|---|
| *A63B 24/00* | (2006.01) |
| *G06N 7/00* | (2006.01) |
| *G06F 17/50* | (2006.01) |
| *G06K 9/00* | (2006.01) |
| *G06K 9/62* | (2006.01) |

(52) U.S. Cl.
CPC ...... *A63B 24/0075* (2013.01); *A63B 24/0006* (2013.01); *G06F 17/5009* (2013.01); *G06K 9/00342* (2013.01); *G06K 9/00671* (2013.01); *G06K 9/6215* (2013.01); *G06N 7/005* (2013.01); *A63B 2024/0012* (2013.01)

(58) Field of Classification Search
CPC ............ A63B 24/0075; A63B 24/0006; A63B 2024/0012; G06K 9/00342
See application file for complete search history.

(56) References Cited

U.S. PATENT DOCUMENTS

| | | | |
|---|---|---|---|
| 7,094,164 B2 * | 8/2006 | Marty | A63B 24/0021 273/317.3 |
| 7,850,552 B2 * | 12/2010 | Marty | A63B 24/0021 473/199 |
| 7,854,669 B2 * | 12/2010 | Marty | A63B 24/0021 473/448 |

(Continued)

*Primary Examiner* — David Duffy
(74) *Attorney, Agent, or Firm* — Baker Botts L.L.P.

(57) ABSTRACT

In one embodiment, a method includes accessing an athletic-performance model of a first user, where the model is based on a plurality of sets of action-parameter values of action parameters of the first user. The action-parameter values may be determined based on biomechanical data of the first user performing a plurality of actions of a first action-type and outcome data of each action. A current skill level of the first user may be determined based on a measure of variances associated with action parameters of the first action-type. Target ranges of action-parameter values may be calculated for action parameters based on the athletic-performance model. Each target range may be based on a measure of probability with respect to the particular action parameters and the outcome data. A report of athletic-performance feedback may be generated and may include current skill level information and the target ranges of action-parameter values.

16 Claims, 15 Drawing Sheets

(56) References Cited

U.S. PATENT DOCUMENTS

| | | | |
|---|---|---|---|
| 9,697,617 B2 * | 7/2017 | Marty | G06T 7/246 |
| 2003/0073518 A1 * | 4/2003 | Marty | A63B 24/0021 473/416 |
| 2007/0026974 A1 * | 2/2007 | Marty | A63B 24/0021 473/467 |
| 2007/0026975 A1 * | 2/2007 | Marty | A63B 24/0021 473/467 |
| 2008/0312010 A1 * | 12/2008 | Marty | A63B 24/0003 473/447 |
| 2011/0143868 A1 * | 6/2011 | Marty | G06T 7/70 473/447 |
| 2015/0279231 A1 * | 10/2015 | Kuo | G09B 19/003 702/19 |

* cited by examiner

MONITORING PERFORMANCE AND GENERATING FEEDBACK WITH ATHLETIC-PERFORMANCE MODELS

TECHNICAL FIELD

This disclosure generally relates to a method of generating models based on sensor data, and in particular to monitoring athletic actions using an athletic-performance monitoring system to generate athletic-performance models.

BACKGROUND

A sensor network may include distributed autonomous sensors. Sensor networks may be used, for example, in industrial process monitoring and control, machine-health monitoring, environment and habitat monitoring, utility usage monitoring, healthcare and medical applications, and sports/athletic applications. A sensor typically includes a communications interface, a controller, and an energy source (such as a battery). sensor may measure a physical quantity and convert it into a signal that a user or another instrument can read. For example, a thermocouple converts temperature to an output voltage that a voltmeter can read. In order to improve accuracy, sensors are typically calibrated against known standards.

The performance of athletes may be monitored using a sensor network in order to improve technique, improve skill level, improve strength and fatigue resistance, and to prevent injury. Various sensors may be used in monitoring and assessing athletic performance.

SUMMARY OF PARTICULAR EMBODIMENTS

Particular embodiments provide receiving biomechanical data of a user from one or more sensors while the user is performing an athletic action (hereinafter simply an "action") of a particular action-type. Outcome data may additionally be received from one or more sensors, the outcome data corresponding to an outcome (e.g., success or failure, positive or negative) for each action performed by the user. The biomechanical data may be analyzed to determine a set of action-parameter values of action parameters (e.g., attributes of the action-type) for each performed action. The action-parameter values may be used to generate an athletic-performance model that is customized to the user.

Particular embodiments provide accessing the athletic-performance model of a user in order to generate feedback for the user to facilitate better performance of actions of the particular action-type. A current skill level of the user may be determined based on the athletic-performance model. The current skill level may be quantified as a measure of one or more variances of one or more action parameters of the particular action-type. Target ranges of action-parameter values may be determined, based on the athletic-performance model. Each target range may be based there being a computed probability that, given an action completed with action-parameter values in the target ranges, the user will have a positive outcome for the action. A report may be generated that includes information regarding the current skill level of the user and the target ranges of action-parameter values. The report may be sent to a client system of the user for display to the user (e.g., at an interface of an application running on the client system).

Particular embodiments provide a sensor environment comprising one or more sensors, including one or more cameras, in which one or more sensors may monitor a user as the user performs one or more actions of a particular action-type. The one or more cameras may be positioned (e.g., mounted on rigging, oriented at the user) to observe the user performing the action and the outcome of the action each time the action is performed. For example, in a sensor environment monitoring a basketball court, the one or more cameras may be positioned to capture the user taking a free-throw shot with a basketball, the arc of the basketball, and the basketball going into or failing to go into the hoop. The video data from the one or more cameras may be sent to a system, where it may be optically processed to determine action-parameter values for each action of the particular action-type performed by the user. An athletic-performance model may be generated for the user based on the action-parameter values and outcome data received from the one or more cameras.

The embodiments disclosed above are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed includes not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

DESCRIPTION OF EXAMPLE EMBODIMENTS

System Overview

Figure 1:
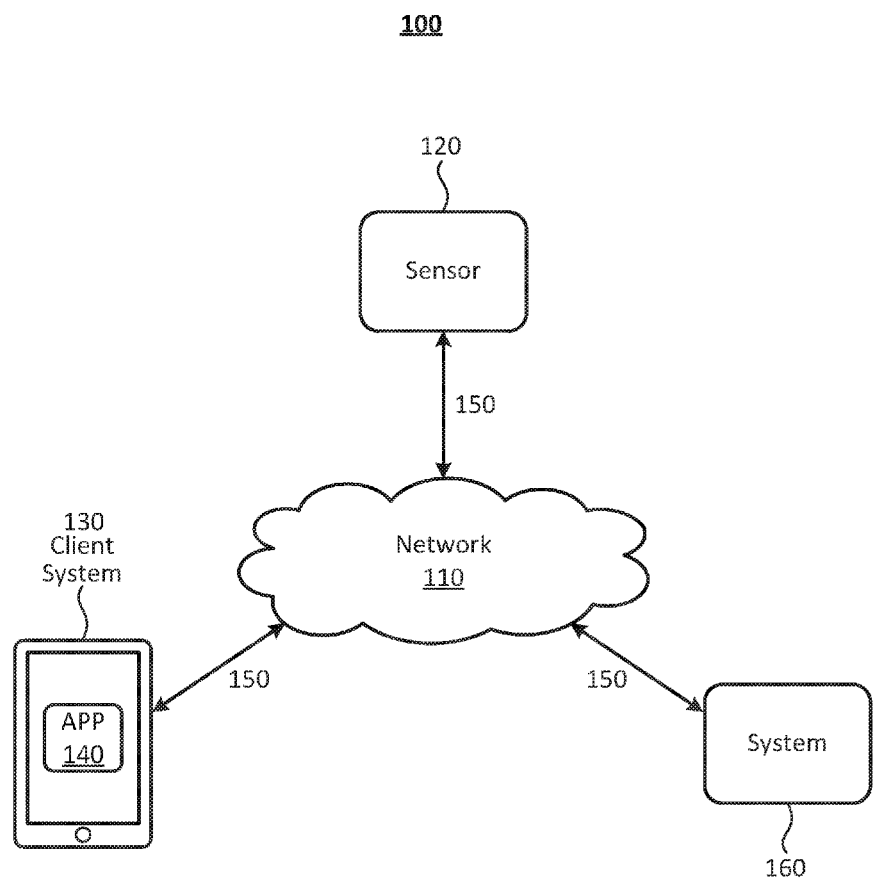
FIG. 1 illustrates an example network environment for generating an athletic-performance model.

FIG. 1 illustrates an example network environment 100 associated with an athletic-performance monitoring system. Network environment 100 includes sensor 120, client system 130, and athletic-performance monitoring system 160 connected to each other by a network 110. Although FIG. 1 illustrates a particular arrangement of sensor 120, client system 130, system 160, and network 110, this disclosure contemplates any suitable arrangement of sensor 120, client system 130, system 160, and network 110. As an example, two or more of sensor 120, client system 130, and system 160 may be connected to each other directly, bypassing network 110. As another example, two or more of sensor 120, client system 130, and system 160 may be physically or logically co-located with each other in whole or in part. Moreover, although FIG. 1 illustrates a particular number of sensors 120, client systems 130, systems 160, and networks 110, this disclosure contemplates any suitable number of sensors 120, client systems 130, systems 160, and networks 110. As an example, network environment 100 may include multiple sensors 120, client systems 130, systems 160, and networks 110. Additionally, although network environment 100 is illustrated and described as including particular components, this disclosure contemplates network environment 100 being implemented using any suitable combination of components.

This disclosure contemplates any suitable network 110. As an example, one or more portions of network 110 may include an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, or a combination of two or more of these. Network 110 may include one or more networks 110.

Links 150 may connect sensor 120, client system 130, and system 160 to communication network 110 or to each other. This disclosure contemplates any suitable links 150. In particular embodiments, one or more links 150 include one or more wireline (such as for example Digital Subscriber Line (DSL) or Data Over Cable Service Interface Specification (DOCSIS)), wireless (such as, for example, Wi-Fi or Worldwide Interoperability for Microwave Access (Wi-MAX)), or optical (such as, for example, Synchronous Optical Network (SONET) or Synchronous Digital Hierarchy (SDH)) links. In particular embodiments, one or more links 150 each include an ad hoc network, an intranet, an extranet, a VPN, a LAN, a WLAN, a WAN, a WWAN, a MAN, a portion of the Internet, a portion of the PSTN, a cellular technology-based network, a satellite communications technology-based network, another link 150, or a combination of two or more such links 150. Links 150 need not necessarily be the same throughout network environment 100. One or more first links 150 may differ in one or more respects from one or more second links 150.

In particular embodiments, sensor 120 may be an electronic device that includes hardware, software, embedded logic components, or a combination of two or more of these components, and that is capable of carrying out the appropriate functionalities implemented or supported by sensor 120. Sensor 120 may be any suitable sensor for detecting information associated with a user performing an action (e.g., an athletic action). Sensor 120 may be any suitable sensor for detecting biomechanical data of a user performing an action (e.g., an athletic action), any suitable sensor for detecting physiological data of a user performing an action, or both. Sensor 120 may also be any suitable sensor for detecting information about one or more items of equipment (e.g., a basketball) associated with a user performing an action. Sensor 120 may be an on-board sensor (e.g., a user-mounted sensor), an off-board sensor (e.g., a sensor that is not mounted on the user, including, for example, a sensor mounted on an item of equipment or mounted on freestanding rigging), any other suitable sensor, or any combination thereof. Sensor 120 may be any suitable number of sensors, including one or more onboard sensors, one or more off-board sensors, or any combination thereof. Sensor 120 may detect time-resolved data, based on which time-resolved parameters may be determined. For example, As an example, sensor 120 may be one or more off-board cameras (e.g., mounted on rigging and directed at a user), and the one or more off-board cameras may detect video data of the bend of the user's knees while performing an action (e.g., a basketball free throw), and system 160 may determine, based on the data, a time-resolved knee-bend angle for the user performing the action. Sensor 120 may be able to communicate, via a wired or wireless connection, with system 160, client system 130, or both. Sensor 120 may send and receive wireless communications via, for example, radio-frequency identification, near-field communication, ultrasonic waves, BLUETOOTH, BLUETOOTH low energy, or any other suitable wireless communication method.

In particular embodiments, client system 130 may be an electronic device including hardware, software, embedded logic components, or a combination of two or more such components, and that is capable of carrying out the appropriate functionalities implemented or supported by client system 130. As an example, a client system 130 may include a computer system such as a desktop computer, notebook or laptop computer, netbook, a tablet computer, e-book reader, Global-Positioning System (GPS) device, camera, personal digital assistant (PDA), handheld electronic device, cellular telephone, smartphone, other suitable electronic device, or any suitable combination thereof. This disclosure contemplates any suitable client systems 130. A client system 130 may enable a network user at client system 130 to access network 110. A client system 130 may enable its user to communicate with other users at other client systems 130.

In particular embodiments, client system 130 may include an application 140. Application 140 may be any suitable application associated with system 160. Application 140 may be a native application running on client system 130. Application 140 may be a web-based application accessed via a web browser (e.g., a web browser running on clients system 130). Application 140 may communicate wirelessly with one or more sensors 120 and system 160. Application 140 may generate athletic-performance models and athletic-performance feedback. Application 140 may provide athletic-performance feedback received from system 160 for display to a user at an interface of client system 130. Application 140 may be launched by user input at an interface of client system 130 or automatically based on settings (e.g., set by the user at client system 130). Application 140 may be capable of providing prompts and any other suitable notifications for display to the user on an interface of client system 130.

In particular embodiments, system 160 may be a network-addressable computing system. System 160 may generate, store, receive, and send athletic-performance data, such as, for example, user information (e.g., profile information), biomechanical data (e.g., received from sensors 120), action-parameter data, outcome data, athletic-performance feedback data, any data associated with one or more athletic-performance models, any other suitable data related to the athletic-performance system, or any combination thereof. System 160 may be accessed by the other components of network environment 100 either directly or via network 110. As an example, client system 130 may access system 160 using a web browser or a native application 140 associated with system 160 (e.g., a mobile athletic-performance application, another suitable application, or any combination thereof) either directly or via network 110. In particular embodiments, system 160 may include one or more servers. Each server may be a unitary server or a distributed server spanning multiple computers or multiple datacenters. Servers may be of various types, including, for example, web server, news server, mail server, message server, advertising server, file server, application server, exchange server, database server, proxy server, another server suitable for performing functions or processes described herein, or any combination thereof.

In particular embodiments, each server may include hardware, software, or embedded logic components or a combination of two or more such components for carrying out the appropriate functionalities implemented or supported by server. In particular embodiments, system 160 may include one or more data stores. Data stores may be used to store various types of information. In particular embodiments, the information stored in data stores may be organized according to specific data structures. In particular embodiments, each data store may be a relational, columnar, correlation, or other suitable database. Although this disclosure describes or illustrates particular types of databases, this disclosure contemplates any suitable types of databases. Particular embodiments may provide interfaces that enable client system 130 or system 160 to manage, retrieve, modify, add, or delete, the information stored in a data store.

Overview of Generating Athletic Performance Models Using Sensor Data

Particular embodiments generate a customized athletic-performance model of a user based on data received from one or more sensors 120. The user may perform an action a plurality of times, and the action may be of an action-type. As used herein, an action-type may be a type of physical action performed by a user and may be made up of one or more biomechanical acts performed concurrently, sequentially, or a combination of both. An action-type may be made up of any suitable number of biomechanical acts. For example, for an action of the basketball-shot action-type, biomechanical acts of the user associated with each action may include one or more of elbow angle, wrist angle, locations of fingers with respect to each other, locations of fingers with respect to a basketball, core position, or knee angle during each basketball-shot. A basketball-shot action-type may be any suitable basketball-shot, including, for example, free-throw shots, three-point shots from particular positions on the basketball court, layups, dunks, swishes (i.e., free-throw shots where the basketball does not touch the rim of the basketball hoop). An action-type may have a beginning and an end defined by the constituent biomechanical acts of the action-type. For example, for a basketball free-throw action-type, the action-type may be defined by a period of action starting with a smallest measured elbow angle and ending with a largest measured elbow angle (e.g., where the elbow angles are measured by an instrumented sleeve on the user's throwing arm). An action-type may have a beginning and an end defined by a predetermined time period (e.g., 5 seconds). Each action performed by a user may be an instance of a particular action-type. For example, the action-type may be a basketball free-throw (i.e., a shot from the free throw line on a basketball court, which is 15 feet from the point on the floor directly below the backboard), and each time the user performs the basketball free-throw, the user is performing an action of the action-type basketball free-throw. In another example, the action-type may be a yoga pose, and the user may perform the action of action-type yoga pose any number of times. An action-type may be, for example, an athletic action performed as part of a team sport (e.g., a soccer pass), an action performed as part of an individual sport (e.g., a golf drive), an action performed by more than one user (e.g., a figure skating lift in pair skating), an action performed with one or more animals (e.g., an equestrian show jump performed on horseback), athletic actions performed with one or more items of equipment (e.g., a basketball free-throw shot), an exercise action (e.g., a series of strides in a sprint), a series of actions (e.g., a choreographed sequence in ballet), any other suitable type of athletic action performed by one or more users, or any combination thereof.

Sensors 120 may detect, record, or otherwise measure biomechanical data of the user performing an action of an action-type. As used herein, biomechanical data may refer to any data that characterizes movement of one or more users (i.e., that characterizes an action of a particular action-type performed by the one or more users). Biomechanical data may include, for example, any suitable data associated with absolute or relative position of one or more parts of the user's body (e.g., feet positions relative to a basketball hoop on a court or finger positions with respect to each other (i.e., finger spacing)), pressure or contact between one or more parts of the user's body and one or more externalities (e.g., between a user's hand and an item of equipment or another user's body), an angle of one or more parts of the user's body (e.g., spine angle, whole body jump angle, knee bend, elbow bend), distance traveled by one or more parts of the user's body (e.g., distance traveled by the user's body across an ice rink during performance of an action), any other suitable biomechanical data, or any combination thereof. Biomechanical data may also include temporal waveforms representing angles, moments, forces, or a combination thereof, of the user's body (e.g., a waveform representing the user's flexion knee angle bend). Biomechanical data may additionally refer to any data that characterizes movement of one or more items of equipment caused by a user performing an action of an action-type that involves the one or more items of equipment. For example, one or more sensors 120 may detect biomechanical data that characterizes the motion of a basketball after being propelled by the user performing an action with the basketball. System 160 may receive the recorded biomechanical data from sensors 120. In particular embodiments, system 160 may dynamically receive biomechanical data from sensors 120 in real time (e.g., over a BLUETOOTH connection). In particular embodiments, system 160 may periodically receive biomechanical data from sensors 120 (e.g., at predetermined time intervals or when plugged into system 160 via any suitable wired connection). In particular embodiments, system 160 may synchronize biomechanical data received from more than one sensor 120. For example, two sensors 120 may each send biomechanical data to system 160, and the biomechanical data received from each of sensors 120 may correspond to the same performed action of an action-type. System 160 may synchronize the received data so that the biomechanical data from both sensors 120 may be analyzed together.

Sensors 120 may additionally detect, record, or otherwise measure outcome data of outcomes corresponding to respective actions of an action-type performed by a user. Outcome data may be any suitable data that includes information about the outcome of an action. For example, outcome data may be video data showing a user performing a basketball free-throw and showing whether the basketball goes into the hoop or not (i.e., the outcome). Sensors 120 may send outcome data to system 160. System 160 may determine an outcome of an action based on the outcome data received from sensors 120. An outcome may be, for example, a binary determination of a success or failure of an action or of a positive or negative outcome of an action. An outcome may be defined with respect the particular action-type. That is, each action-type may be associated with particular possible outcomes and criteria for categorizing a result of an action as one of the possible outcomes. In particular embodiments, system 160 may receive biomechanical data from a different sensor 120 than the particular sensor 120 from which outcome data is received. System 160 may then synchronize the received biomechanical data with the received outcome data such that an outcome may be determined for each action, and the correct outcome may be associated with particular biomechanical data (i.e., the outcome and biomechanical data correspond to the same action).

System 160 may receive biomechanical data from sensors 120 for a user performing a plurality of actions of an action-type. System 160 may determine, based on the received biomechanical data, a plurality of sets of action-parameter values corresponding to the respective plurality of actions performed by the user. For each action of a particular action-type performed by the user, system 160 may determine a set of values of action parameters. As used herein, an action parameter may refer to any suitable parameters that characterize an action of an action-type. Action parameters may be specific to the particular action-type being evaluated by system 160. For example, action parameters for a basketball free-throw shot may include release velocity, release angle, release position, and rotational velocity, which may be determined based on biomechanical data received from one or more sensors 120. In particular embodiments, each set of action-parameter values for an action of a particular action-type may partially or fully characterize the action such that system 160 may probabilistically or absolutely predict the outcome of the action without receiving outcome data from sensors 120. That is, the particular set of action parameters and the number of action parameters in the set may depend on the particular action-type of the action being performed by the user. In particular embodiments, action-parameter values may be time-resolved for each action of a particular action-type.

In particular embodiments, system 160 may generate a personalized athletic-performance model of the user based on a plurality of sets of action-parameter values determined for a plurality of actions of an action-type performed by the user. An athletic-performance model may be further based on the outcome data corresponding to outcomes for the plurality of actions performed by the user. As used herein, an athletic-performance model may refer to a statistical model that is associated with a particular action-type and a particular user. In particular embodiments, an athletic-performance model may be specific to a current determined skill level of the user (e.g., novice, intermediate, or expert). An athletic-performance model may be customized to one or more attributes of the user. For example, customizable attributes of the user including, for example, age, gender, any other physiological attributes of the user (e.g., height, hand size, finger lengths, shoe size, body type), skill level, any other suitable attributes of the user, or any combination thereof. System 160 may dynamically generate an athletic-performance model of a user for a particular action-type based on sets of action-parameter values determined based on biomechanical information received from sensors 120.

Example Sensors and Sensor Environments

Any suitable sensors 120 may be used to detect, record, or otherwise measure biomechanical data of the user, based on which the athletic-performance model may be generated by system 160. Example sensors 120A and 120B (collectively sensors 120) are illustrated and described in FIGS. 2A-2B, 3A-3B, and 4.

Figure 2A:
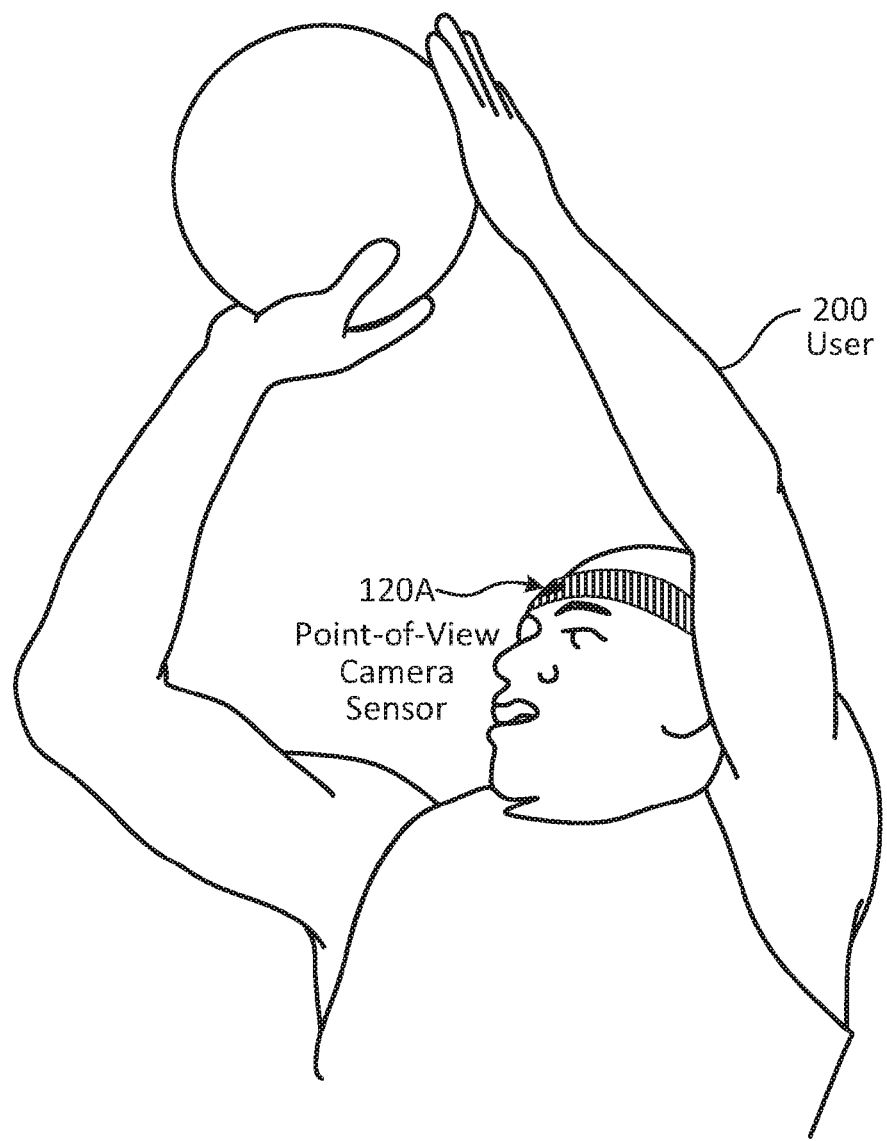
FIG. 2A illustrates an example point-of-view camera sensor.

FIG. 2A illustrates an example point-of-view (POV) camera sensor 120A. User 200 is depicted as wearing POV camera sensor 120A. POV camera sensor 120A may be mounted on the head of user 200 in order to record video data that is associated with a field of view of user 200. POV camera sensor 120A may include one or more cameras mounted on any suitable headband or other suitable structure for attaching the one or more cameras to the head of user 200 (e.g., a camera mounted on glasses, goggles, or a helmet). The head-mounted camera may be, for example, a GOPRO camera or any other suitable camera for recording video data. Although user 200 is depicted in FIG. 2A as performing an action of a basketball action-type (e.g., a free-throw), it will be understood that this is by way of illustration, not by way of limitation, and that POV camera sensor 120A may be used to detect biomechanical data of a user performing actions of any suitable action-type. For example, POV camera sensor 120A may detect biomechanical data of a user performing a plurality of actions of a golf-swing action-type.

Figure 2B:
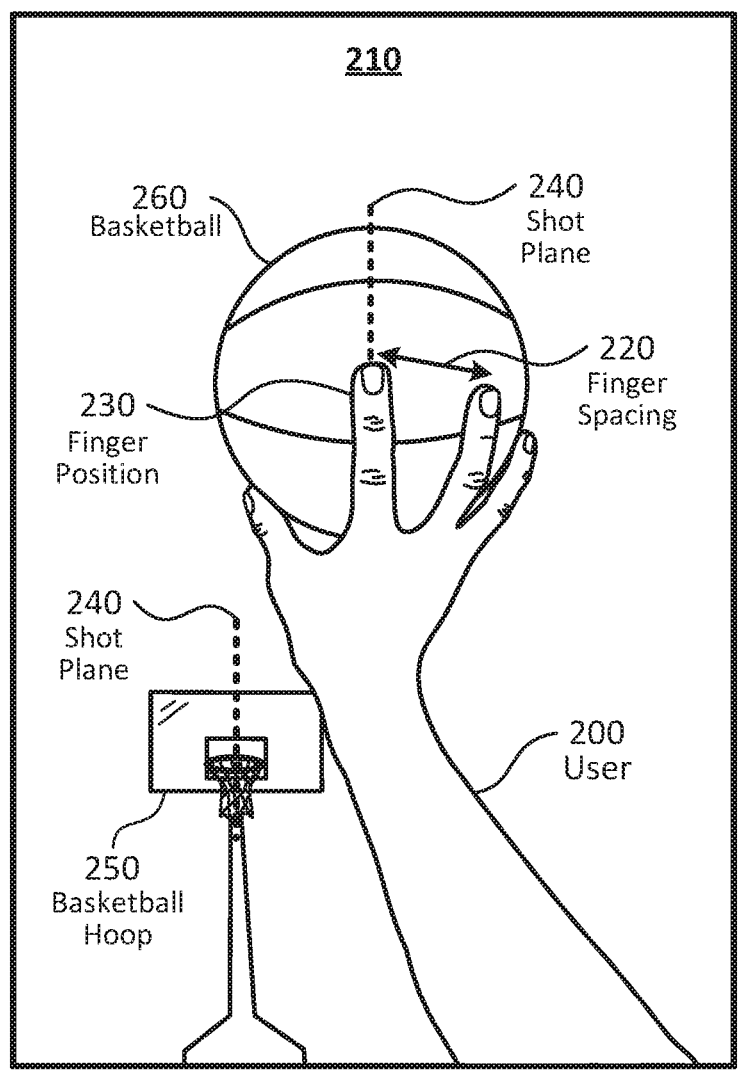
FIG. 2B illustrates an example view of a point-of-view camera sensor.

FIG. 2B illustrates an example scene 210 of a point-of-view camera sensor 120A. Scene 210 may be recorded, for example, using POV camera sensor 120A depicted in FIG. 2A. In particular embodiments, POV camera sensor 120A may be positioned on the head of user 200 so that video data of the user's hand position, basketball 260, and basketball hoop 250 may be recorded by the POV camera sensor 120A, as shown in view 210.

System 160 may optically process video data received from POV camera sensor 120A. System 160 may orient the scene recorded by a head-mounted camera with respect to the backboard of basketball hoop 250 or with respect to any other suitable identifiable object in the environment (e.g., courtside orientation) using optical processing techniques. Once oriented with respect to the backboard of basketball hoop 250, system 160 may locate basketball 260 in the video data using optical processing techniques. System 160 may dynamically generate a shot plane 240 based on the location of the basketball 260 and the location of the backboard of basketball hoop 250 in the video data. In particular embodiments, shot plane 240 may vertically bisect the backboard of basketball hoop 250 and basketball 260. In the illustrated embodiment of FIG. 2B, shot plane 240 is a vertical plane that crosses through two vertical, dashed lines, the first line bisecting the backboard of basketball hoop 250 and the second line bisecting basketball 260.

In particular embodiments, system 160 may optically process video data (i.e., biomechanical data) of the user performing a plurality of actions of a basketball free-throw action-type received from POV camera sensor 120A to determine a plurality of sets of action-parameter values corresponding to the respective plurality of actions. System 160 may optically process the video data from scene 210 to locate the fingers of user 200 with respect to each other in order to determine finger spacing 220. Finger spacing 220 may be measured, for example, based on a distance between the fingertips of the index and middle fingers of user 200 or as an angle between the index and middle fingers of user 200. System 160 may also optically process the video data from scene 210 to locate the fingers of user 200 with respect to shot plane 240 to determine finger position 230. For example, finger position 230 may be a measure of distance between the index finger of user 200 and shot plane 240. It will be understood that finger spacing 220 and finger position 230 are examples of a plurality of action parameters that may be determined based on video data received from POV camera sensor 120A. Other action parameters that may be determined based on the video data received from POV camera sensor 120A may include, for example, release velocity of basketball 260, release angle of basketball 260, release rotational velocity of basketball 260, any other suitable action parameters, or any combination thereof. In particular embodiments, one or more of the action parameters may be determined using optical processing techniques. For example, system 160 may optically process video data of basketball 260 to determine release angle and release velocity of basketball (e.g., by analyzing optical markers positioned on basketball 260 as shown in video data). As another example, system 160 may determine the location of the user with respect to one or more reference points (e.g., the location of the user with respect to basketball hoop 250) by image processing the video data (e.g., determining that an object shown in the video data is the backboard based on shape and size of object). In particular embodiments, system 160 may determine time-resolved finger position 230 and time-resolved finger spacing 220. In another example, system 160 may determine, by optically processing the video data, finger position 230 and finger spacing 220 at the time of release of basketball 260. In particular embodiments, because basketball hoop 250 is in view 210, POV camera sensor 120A may record outcome data corresponding to outcomes of respective actions. System 160 may determine an outcome of each action recorded by POV camera sensor 120A based on outcome data received from POV camera sensor 120A.

Although this disclosure describes and illustrates particular embodiments of FIGS. 2A-2B as being implemented by system 160, this disclosure contemplates any suitable embodiments of FIGS. 2A-2B as being implemented by any suitable platform or system. As an example, particular embodiments of FIGS. 2A-2B may be implemented by client system 130. Furthermore, although this disclosure describes and illustrates particular components, devices, or systems carrying out particular steps of the method of FIGS. 2A-2B, this disclosure contemplates any suitable combination of any suitable components, devices, or systems carrying out any suitable steps of the method of FIGS. 2A-2B.

Figure 3A:
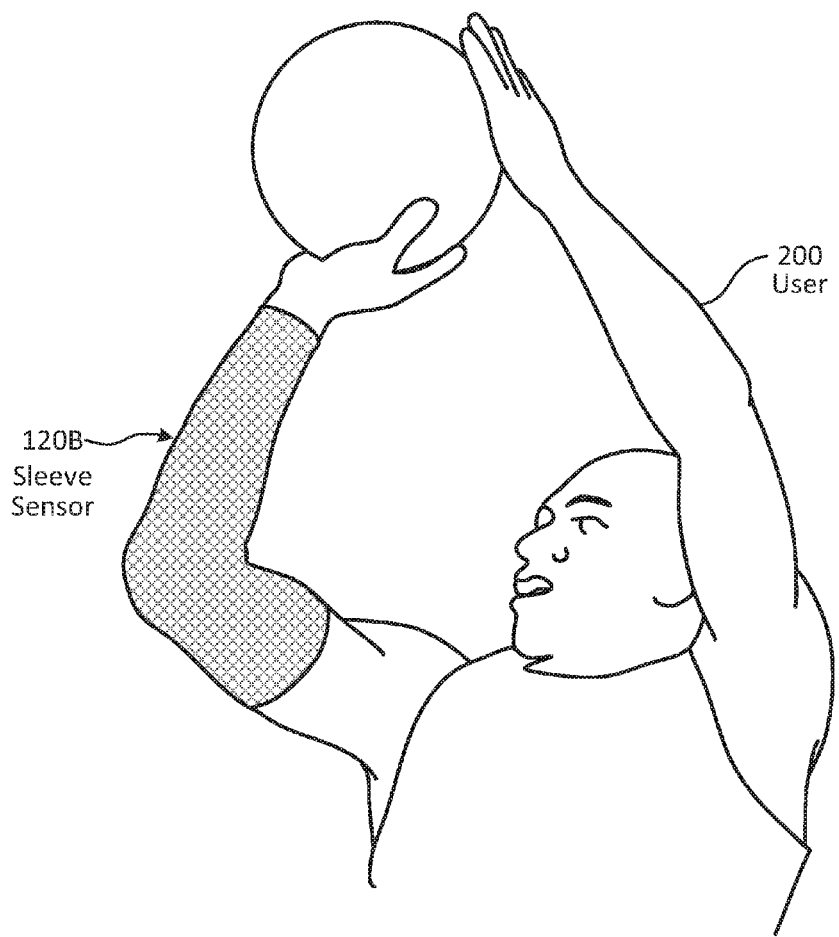
FIG. 3A illustrates an example sleeve sensor.

FIG. 3A illustrates an example sleeve sensor 120B. Sleeve sensor 120B may be worn on one or both of the arms of user 200 (e.g., arm of dominant hand). Sleeve sensor 120B may include one or more inertial measurement units (IMUs), any other suitable electronics for determining biomechanical data of the user, or any combination thereof. In particular embodiments, sleeve sensor 120B may have one or more passive markers, active markers, or both incorporated into it to facilitate motion tracking by one or more camera sensors 120 (e.g., POV camera sensor 120A). Although user 200 is depicted in FIG. 3A as performing an action of a basketball action-type (e.g., a free-throw), it will be understood that this is by way of illustration, not by way of limitation, and that sleeve sensor 120B may be used to detect biomechanical data of a user performing actions of any suitable action-type. For example, sleeve sensor 120B may be detect biomechanical data of a user performing a plurality of actions of a tennis-swing action-type (e.g., a tennis serve). In particular embodiments, sleeve sensor 120B may be one of a plurality of sensors determining biomechanical data of the user. As an example, sleeve sensor 120B may be one component of an instrumented shirt, which may also include one or more sensors for determining the core position of user 200. System 160 may synchronize the biomechanical data determined by each sensor in time and process the time-synchronized biomechanical data to determine one or more action parameters.

Figure 3B:
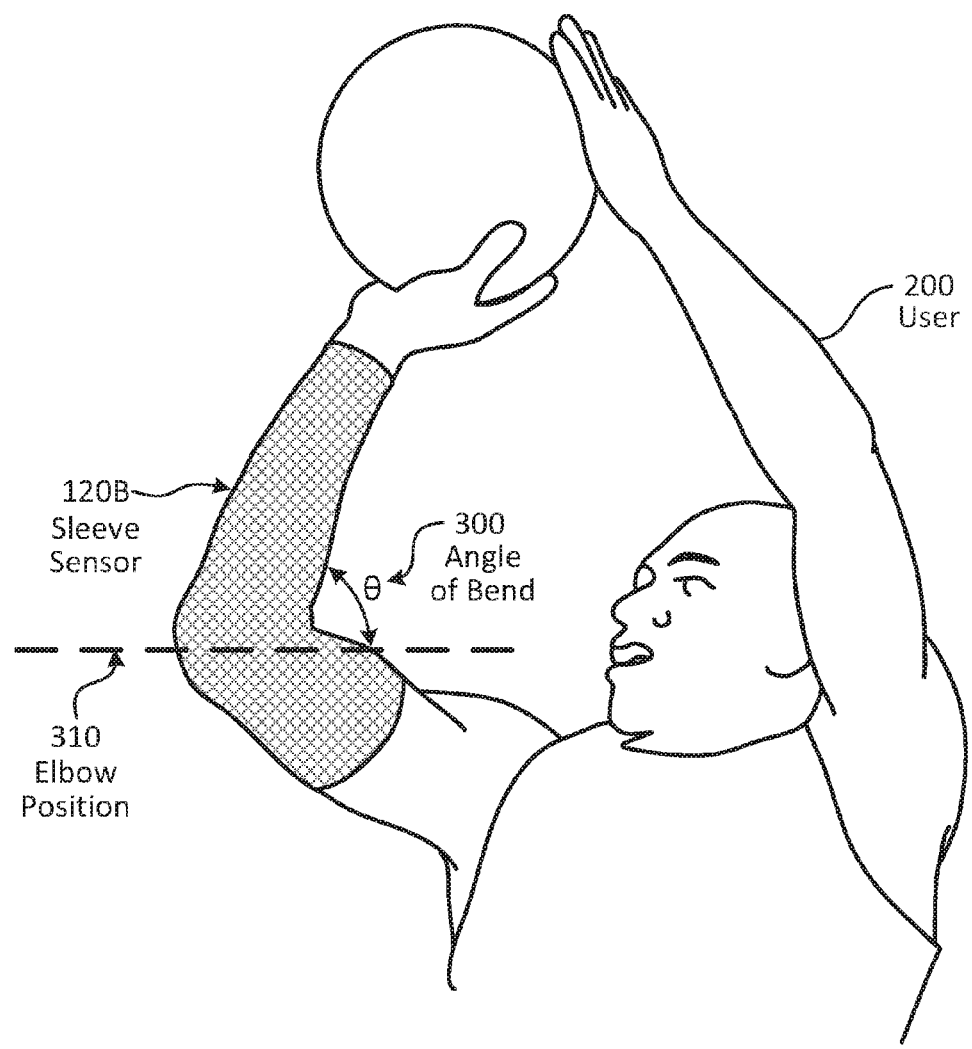
FIG. 3B illustrates example action parameters determined using an example sleeve sensor.

FIG. 3B illustrates example action parameters determined using an example sleeve sensor 120B. In particular embodiments, system 160 may process biomechanical data of the user performing a plurality of actions of a basketball free-throw action-type received from sleeve sensor 120B to determine a plurality of sets of action-parameter values corresponding to the respective plurality of actions. System 160 may process biomechanical data received from sleeve sensor 120B to determine angle of bend 300 of an elbow of user 200. System 160 may process biomechanical data received from sleeve sensor 120B to determine elbow position 310. Elbow position 310 may be, for example, a height off the ground, an orientation with respect to basketball hoop 250, or any other suitable elbow position 310 that characterizes an action of the basketball free-throw action-type. It will be understood that angle of bend 300 and elbow position 310 are examples of a plurality of action parameters that may be determined based on biomechanical data received from sleeve sensor 120B. Other action parameters that may be determined based on the mechanical data received from sleeve sensor 120B may include, for example, release velocity, release angle, release rotational velocity, any other suitable action parameters, or any combination thereof. In particular embodiments, system 160 may determine time-resolved angle of bend 300 and time-resolved elbow position 310. In particular embodiments, sleeve sensor 120B may be used in conjunction with one or more additional sensors 120. For example, user 200 may wear sleeve sensor 120B and POV camera sensor 120A, and both sensors 120A-B may send biomechanical data to system 160. System 160 may then synchronize the biomechanical data from both sensors 120A-B and may process the biomechanical data to determine a set of action-parameter values for each action performed by user 200.

Although this disclosure describes and illustrates particular embodiments of FIGS. 3A-3B as being implemented by system 160, this disclosure contemplates any suitable embodiments of FIGS. 3A-3B as being implemented by any suitable platform or system. As an example, particular embodiments of FIGS. 3A-3B may be implemented by client system 130. Furthermore, although this disclosure describes and illustrates particular components, devices, or systems carrying out particular steps of the method of FIGS. 3A-3B, this disclosure contemplates any suitable combination of any suitable components, devices, or systems carrying out any suitable steps of the method of FIGS. 3A-3B.

Although particular sensors 120 are depicted and described in connection with FIGS. 2A-2B and 3A-3B, it will be understood that these sensors 120 are presented for illustrative purposes and not by way of limitation. It will be further understood that any suitable sensors 120 may be used to detect, record, or otherwise measure biomechanical data of a user performing actions of a particular action-type. System 160 may receive biomechanical data from any number of sensors 120. The biomechanical data from any number of sensors 120 may be synchronized in time, and action-parameter values may be determined based on the synchronized biomechanical data received from sensors 120. In particular embodiments, sensor 120 may be one or more onboard sensors (e.g., user-mounted sensors), one or more off-board sensors (e.g., sensors not mounted on user 200), or any combination thereof. Sensors 120 may include, as an example, one or more of POV camera sensors 120A, sleeve sensors 120B, any other suitable camera sensors, light sensors, motion sensors, audio sensors, load/pressure sensors, location sensors (e.g., using GPS), IMUS, accelerometers, physiological-parameter sensors, proximity sensors, electroencephalogram (EEG) sensors (e.g., for tracking electrical brain activity), electromyography (EMG) sensors, any other suitable sensor for detecting, recording, or otherwise measuring biomechanical data, or any combination thereof. Any suitable number of sensors 120 may be incorporated into a wearable sensor, including, for example, instrumented belts, instrumented vests, instrumented wristbands, instrumented gloves, instrumented socks, instrumented headbands, instrumented sleeves, instrumented glasses (e.g., for tracking eye positions), any other suitable wearable sensor. As an example, sensor 120 may be smart socks, which may include IMU electronics, pressure sensor electronics, or both, and system 160 may be able to determine action-parameter values for action parameters including, for example, spacing, pressure, position, and distance traveled with respect to the feet of user 200. Off-board sensors 120 may be, for example, sensors incorporated into a sensor environment (e.g., courtside cameras).

Figure 4:
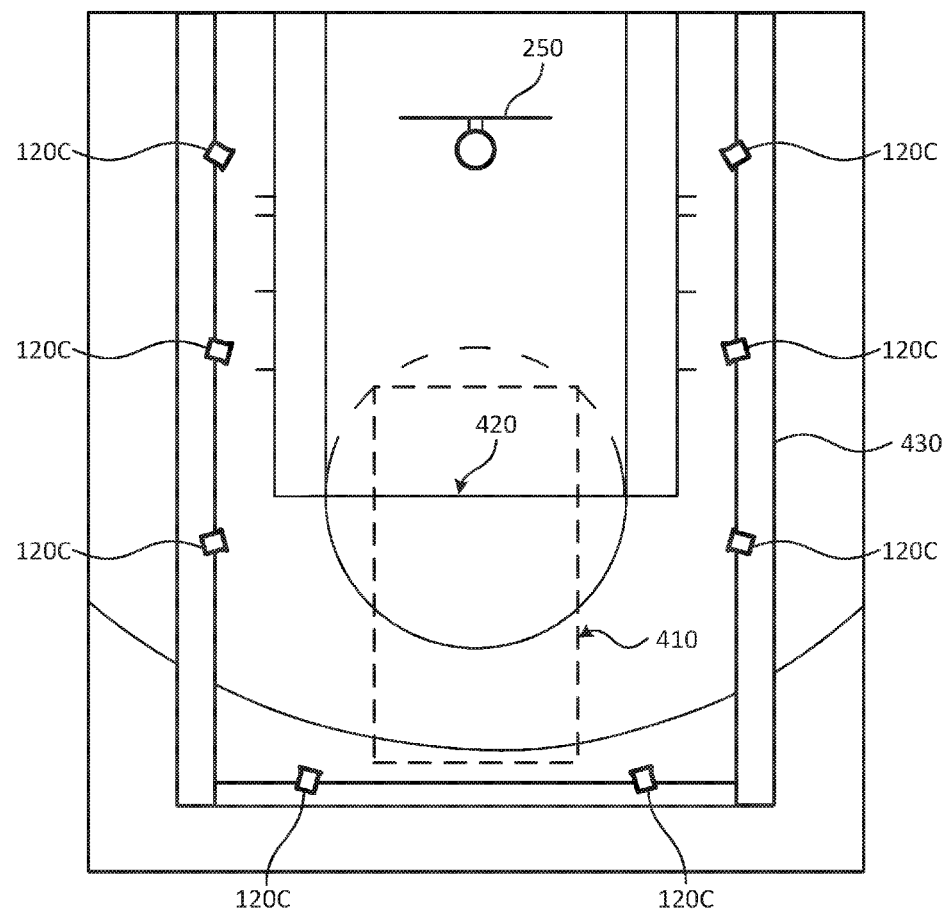
FIG. 4 illustrates an example sensor environment for capturing biomechanical data of a user.

FIG. 4 illustrates an example sensor environment 400 for capturing biomechanical data of a user 200. Sensor environment 400 is depicted as an elevation view from above of a portion of a basketball court. The basketball court includes basketball hoop 250 (which is at a known height) and free-throw line 420 (which is a known distance from basketball hoop 250). Sensor environment 400 also includes rigging 430, which may be any suitable rigging (e.g., freestanding rigging or rigging secured to any suitable element in sensor environment 400), rafters of a building (e.g., an arena), or any other suitable structure for supporting camera sensors 120C. Camera sensors 120C may be any suitable cameras for recording video data. Each camera sensor 120C may be attached to rigging 430. Although sensor environment 400 is depicted as being a basketball court, it will be understood that this is for illustrative purposes, not by way of limitation, and rigging 430 and camera sensors 120C may be customized to and positioned on any suitable sensor environment (e.g., a tennis court).

In particular embodiments, camera sensors 120C may be positioned to capture (e.g., to record video data covering) a three-dimensional area 410. Camera sensors 120C may be positioned so that area 410 includes a position at which user 200 may perform actions of a particular action-type. In the illustrated example of FIG. 4, area 410 includes free-throw line 420, at which user 200 may perform actions of a basketball free-throw action-type. Camera sensors 120C may be positioned based on the action-type of the actions performed by the user. For example, for a basketball free-throw action-type, each camera sensor 120C may be positioned at a height that is sufficiently high to capture the free-throw action. In the same example, one or more camera sensors 120C may be positioned at the height of the initial ball trajectory (e.g., based on average height of basketball players or based on the specific height of a particular user 200). In particular embodiments, camera sensors 120C may be positioned such that particular action parameters (e.g., release velocity of a basketball) may be determined by system 160 based on video data captured by one or more camera sensors 120C. In particular embodiments, camera sensors 120C may be positioned so as to further cover an area such that the information associated with one or more biomechanical acts of user 200 may be determined. For example, for a basketball-shot action, the cameras may be positioned such that information associated with one or more of elbow angle, wrist angle, locations of fingers with respect to each other, locations of fingers with respect to a basketball, core position, knee angle, or any combination thereof, may be determined by system 160 based on video data from camera sensors 120C. Although the illustrated embodiment of FIG. 4 depicts eight camera sensors 120C, this is for illustrative purposes, not by way of limitation, and any suitable number of camera sensors 120C may be used. Additional camera sensors 120C may be used in order to record video data of a larger area 410, for example, to include more of the basketball trajectory. The particular number of camera sensors 120C and the positions of the camera sensors 120C may be altered depending on the action-type being evaluated by system 160. In particular embodiments, because basketball hoop 250 may be in view of one or more camera sensors 120C, camera sensors 120C may record outcome data corresponding to outcomes of respective actions. System 160 may determine an outcome of each action recorded by camera sensors 120C based on outcome data received from camera sensors 120C.

Although this disclosure describes and illustrates particular embodiments of FIG. 4 as being implemented by system 160, this disclosure contemplates any suitable embodiments of FIG. 4 as being implemented by any suitable platform or system. As an example, particular embodiments of FIG. 4 may be implemented by client system 130. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Figure 5A:
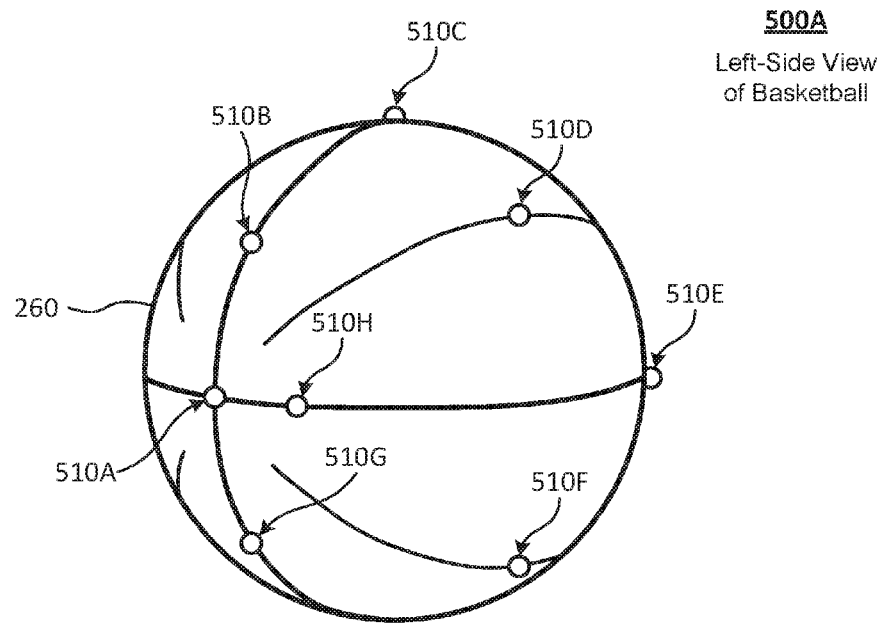
FIG. 5A illustrates an example left-side view of a basketball with markers.
Figure 5B:
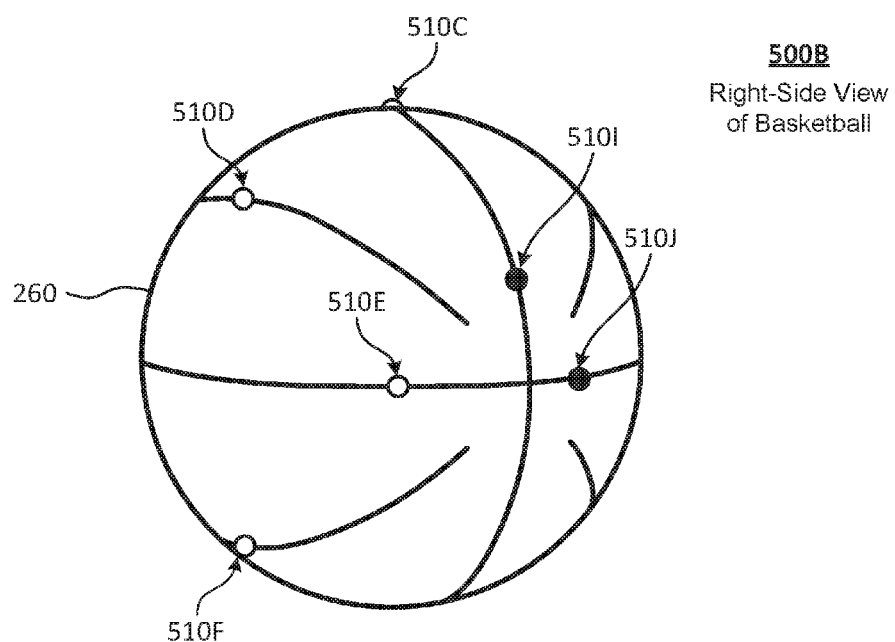
FIG. 5B illustrates an example right-side view of a basketball with markers.

In particular embodiments, camera sensors 120C may be used with any suitable number of optical markers. Video data received from camera sensors 120C may include footage of optical markers, and system 160 may user the optical markers to determine action-parameter values of one or more action parameters, respectively, for actions performed by user 200 of a particular action-type (e.g., a basketball-shot action-type). Optical markers may be placed on user 200 (e.g., removable markers may be affixed to the user or markers may be incorporated into one or more wearable sensors worn by user 200), one or more items of equipment, or both. FIGS. 5A and 5B depict illustrative optical markers on basketball 260.

FIG. 5A illustrates an example left-side view 500A of a basketball 260 with markers 510. Eight markers 510A, 510B, 510C, 510D, 510E, 510F, 510G, and 510H (collectively, markers 510) are depicted as affixed to basketball 260. FIG. 5B illustrates an example right-side view 500B of a basketball 260 with markers 510. Four markers shown in FIG. 5A are repeated in FIG. 5B, markers 510C, 510D, 510E, and 510F. Two additional markers are shown in FIG. 5B, markers 510I and 510J, depicted as solid black circles for clarity. Together, FIGS. 5A and 5B illustrate a total of ten unique optical markers affixed (e.g., adhesively) to basketball 260. It will be understood, however, that this is for illustrative purposes only, not by way of limitation, and that any suitable number of markers may be placed on basketball 260 in any suitable locations. Markers 510 may be, for example, one square inch, retro-reflective stickers. Camera sensors 120 (e.g., camera sensors 120C depicted in FIG. 4) may capture video data of user 200 performing one of more actions of a basketball-shot action-type, and the basketball 260 used by user 200 in performing the actions may be equipped with markers 510. System 160 may receive video data from camera sensors 120 and may process the video data, using markers 510, to determine values of action parameters (e.g., initial velocity) for each action performed by user 200. System 160 may track markers 510 in the received video data using optical processing techniques. Accordingly, system 160 may track, for example, the position and spin of ball 260 at all times in video data in which basketball 260 is shown, and system 160 may then determine action-parameter values for each action performed by the user. Video data may additionally include biomechanical data regarding one or more biomechanical acts of user 200 that affect action-parameter values of the action. Action-parameter values determined by system 160 based on the video data and markers 510 for an action of a basketball-shot action-type may include, for example, basketball release angle, basketball release velocity (i.e., initial velocity), and basketball 260 spin (i.e., rotational velocity). In the same example, release velocity may be computed based on three component velocities: vertical velocity, horizontal velocity, and cross-court velocity. Vertical velocity and horizontal velocity may be computed using linear models, and cross-court velocity may be modeled as a constant (e.g., drag, which may be a negligible value). Release angle may be computed, for example, based on the trajectory slope when the ball is released. Ball spin may be computed, for example, as an angular rate of change about each of three coordinate axes (e.g., Cartesian xyz-coordinate axes).

FIGS. 5A and 5B collectively illustrate one example placement for markers 510 on basketball 260. There may be any suitable number of markers 510 attached to basketball 260 in any suitable pattern and attached using any suitable method (e.g., semi-permanent adhesive markers or permanently-embedded markers). In particular embodiments, the positioning of markers 510 on basketball 260 may be dependent on the positions of the camera sensors 120 in the sensor environment. For example, markings 510 may be optimally placed on basketball 260 at positions where each marker 510 is visible to the greatest number of camera sensors 120 (e.g., at a point in time in video data from the camera sensors 120). In particular embodiments, there may be at least one position within an area captured by camera sensors 120 at which each of markers 510 may be visible to at least a threshold number of camera sensors 120 (e.g., three camera sensors 120). For example, for a basketball free-throw action-type in sensor environment 400 of FIG. 4, markers 510 may be positioned on basketball 260 such that each marker 510 is visible to at least three camera sensors 120C at a position in area 410. In particular embodiments, markers 510 may be placed in an asymmetric pattern on basketball 260 so that camera sensors 120 may capture a unique pattern traced by markers 510 as basketball 260 is propelled by user 200 performing an action of a basketball-shot action-type, thus allowing the exact orientation and rotation of the symmetric basketball 260 to be tracked. In particular embodiments, markers 510 may be placed on basketball 260 such that their average position (e.g., on three-dimensional Cartesian xyz-coordinate axes) is determinable and such that the difference between the average position of markers 510 and the centroid of basketball 260 is also determinable. System 160 may use the difference between the average position of markers 510 and the centroid of basketball 260 to determine the position of basketball 260 with respect to the centroid of basketball 260 rather than with respect to the average location of markers 510.

In particular embodiments, markers 510 may also be placed on user 200 in order to track (e.g., using camera sensors 120) biomechanical data of user 200 performing an action. In particular embodiments, video data from camera sensors 120 (with or without markers 510) may be used in connection with biomechanical data from any number of other suitable sensors 120. System 160 may synchronize the video data and other received biomechanical data in time, and system 160 may determine a set of one or more action-parameter values for action parameters of each action of a particular action-type performed by user 200. System 160 may generate an athletic-performance model based on determined action-parameter values for actions of a particular action-type. Generating an athletic-performance model is described in further detail connection with FIG. 6.

Although this disclosure describes and illustrates particular embodiments of FIGS. 5A-5B as being implemented by system 160, this disclosure contemplates any suitable embodiments of FIGS. 5A-5B as being implemented by any suitable platform or system. As an example, particular embodiments of FIGS. 5A-5B may be implemented by client system 130. Furthermore, although this disclosure describes and illustrates particular components, devices, or systems carrying out particular steps of the method of FIGS. 5A-5B, this disclosure contemplates any suitable combination of any suitable components, devices, or systems carrying out any suitable steps of the method of FIGS. 5A-5B.

Athletic-Performance Models

Figure 6:
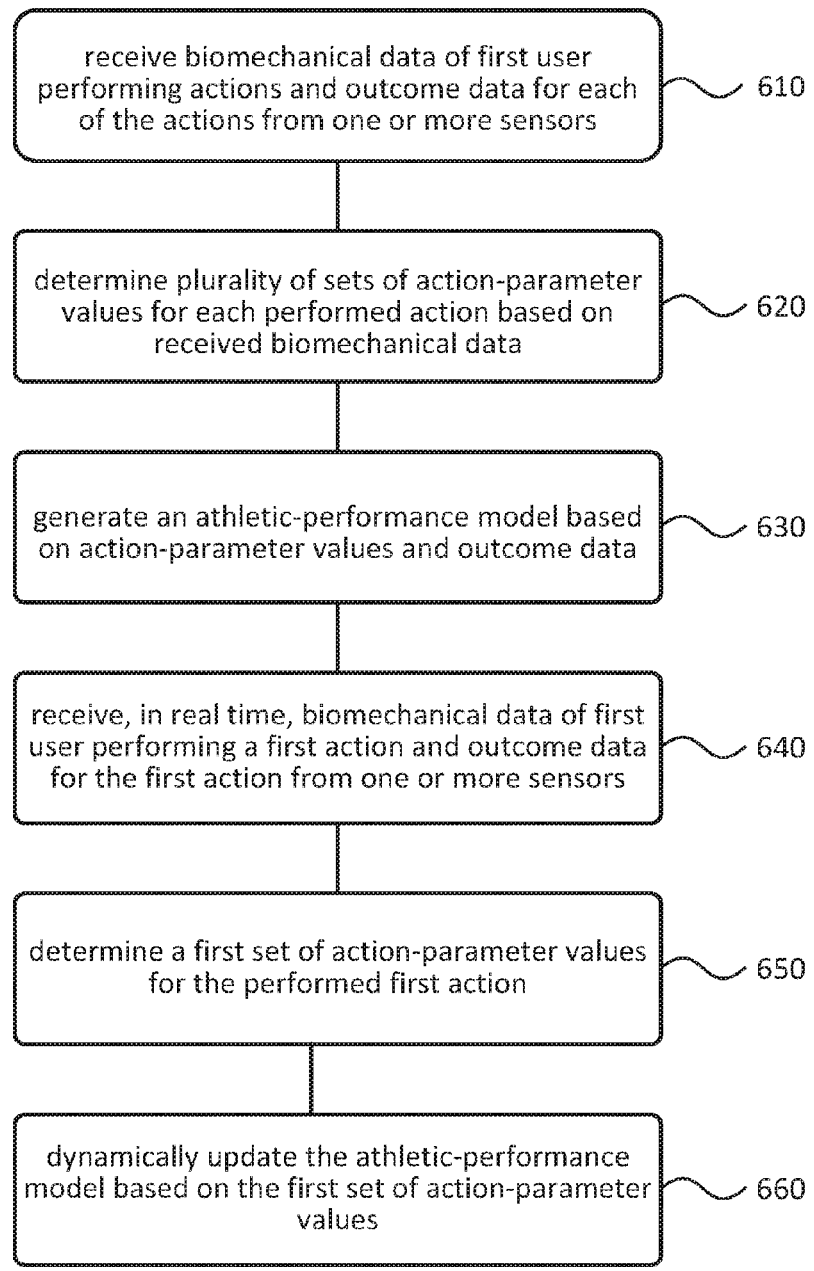
FIG. 6 illustrates an example method for generating and updating an athletic-performance model.

FIG. 6 illustrates an example method 600 for generating and updating an athletic-performance model. At step 610, system 160 may receive biomechanical data of a user (e.g., a first user) performing actions of a particular action-type (e.g., a first action-type) from one or more sensors 120. If biomechanical data is received from more than one sensor 120, system 160 may synchronize the received biomechanical data in time (e.g., for each action performed by the user). System 160 may additionally receive outcome data for each of the actions performed by the user from one or more sensors 120. System 160 may associate outcome data to a corresponding outcome for each action. At step 620, system 160 may determine a plurality of sets of action-parameter values for a plurality of actions performed by the user, respectively, based on the biomechanical data received from sensors 120. In other words, for each action, a set of action-parameter values may be determined. System 160 may determine action-parameter values directly (e.g., determining the position of the user's fingers on basketball 260 based on video data showing the position of the user's fingers) or indirectly (e.g., inferring the position of the user's fingers on basketball 260 based on pressure sensors in basketball 260). In particular embodiments, system 160 may infer outcome data based on action-parameter values determined at step 620 instead of or in addition to receiving outcome data at step 610 (e.g., determining that a free-throw shot went into hoop based on, for example, the release velocity, release angle, and release position of the basketball during the shot).

At step 630, system 160 may generate an athletic-performance model based on the determined action-parameter values for each action performed by the user and based on the outcome data. The athletic-performance model may be a statistical model of the user's performance for the action-type. The athletic-performance model may be n-dimensional model, where each of the n-dimensions corresponds to an action-parameter or another suitable independent variable, and where n denotes a positive integer. The athletic-performance model may include probabilities computed with respect to the determined sets of action-parameter values for n athletic parameters and outcome data. In particular embodiments, the athletic-performance model may be represented as an n-dimensional plot. In generating the athletic-performance model of the user, system 160 may compute, probabilities of a particular outcome (e.g., making a basketball shot) based on combinations of action-parameter values of the user. The athletic-performance model may be specific to the action-type of the actions being performed by the user. As an example, the athletic-performance model may be an algorithm based on biomechanical data from one or more sensors 120 over a predetermined period. The athletic-performance model may include any suitable variables, including data from one or more data streams and one or more fixed variables. System 160 may generate the following example algorithm to model the athletic-performance of a user:

$$f_{ap} = f(D_{AP}^1, \ldots, D_{AP}^N, \ldots, X^M)$$

where:
$f_{ap}$ denotes the athletic-performance model of a user,
$D_{AP}^1, \ldots, D_{AP}^N$ denotes action-parameters of the action-type 1 through N, and
$X^1, \ldots, X^M$ denote fixed variables 1 through M.

In particular embodiments, the athletic-performance model for an action-type may be based on a particular set of action parameters, and each action parameter may be weighted in the athletic-performance model according to its relative importance with respect to the action-type. As an example, an athletic-performance model for a basketball free-throw action-type may be based on action parameters including basketball release angle, basketball release velocity, and basketball rotational velocity. In this example, system 160 may assign higher weights to basketball release angle and basketball release velocity than to basketball rotational velocity, which system 160 may determine to have a lesser effect on a particular outcome than the other action parameters. As another example, system 160 may determine that particular biomechanical acts may have a greater effect on a particular outcome than other biomechanical acts. System 160 may assign higher weights to action parameters that are based on or resulting from the biomechanical acts having the greater effect than to the other action parameters. The athletic-performance model may be customized to one or more attributes of the user, including, for example, gender, height, hand size, foot size, body type, arm length, leg length, fitness level, any other physical attributes of the user, dimensions of an item of equipment being used by the user in performing the actions (e.g., a size of a basketball 260 or a size of the head of a tennis racquet), any other attributes of equipment, any other suitable attributes of the user, or any combination thereof. The athletic-performance model may also include information related to a mental state of the user. For example, system 160 may generate the athletic-performance model based on biomechanical data recorded when the user was performing under particular conditions (e.g., during stressful conditions, such as during the fourth quarter of a basketball game for an athletic-performance model based on a basketball-shot action-type, or during a tennis match in the finals of a tournament for an athletic-performance model based on a tennis-shot action-type).

In particular embodiments, the athletic-performance model may include information pertaining to a current skill level of the user. System 160 may determine a current skill level of the user based on the athletic-performance model of the user. System 160 may determine the current skill level based on a measure of one or more variances associated with one or more action parameters of the action-type. A lower variance with respect to a particular action-type may correspond to a higher skill level, while a higher variance with respect to the particular action-type may correspond to a lower skill level. System 160 may analyze the determined action-parameter values for one or more action parameters of the action-type to calculate a statistical measure of variance for each of the one or more action parameters (e.g., a measure of how spread out the values of an action parameter are). A lower statistical measure of variance for a particular action parameter may indicate less variability with respect to the particular action parameter across the actions taken by the user of the action-type (e.g., if all action-parameter values are the same value, the statistical measure of variance may be zero). For example, for a golf-swing action-type, the user may demonstrate a lack of consistency in swinging a golf club along an ideal swing plane across a number of golf-swing actions. In this same example, his lack of consistency may result in a high statistical measure of variance with respect to a golf-swing plane action parameter. As another example, for a basketball free-throw action-type, the user may demonstrate consistency in his basketball release angle across a number of free-throw actions. In this same example, the user's consistent release angle may result in a low statistical measure of variance with respect to a release-angle action parameter. System 160 may combine the one or more statistical measures of variance in any suitable way. For example, system 160 may determine an average of the one or more statistical measures of variance. As another example, system 160 may determine a weighted average of the one or more statistical measures of variance. The weights may be based on, for example, a determined effect of the action parameters of each statistical measure of variance on a particular outcome. In particular embodiments, system 160 may determine the current skill level of the user based on any suitable statistical description of the determined sets of action-parameter values. For example, for a basketball free-throw action-type, the user may have a high skill level if his action-parameter values for basketball release velocity and basketball release angle present small variances across a plurality of actions performed by the user. In particular embodiments, the current skill level of the user may be represented as a number (e.g., calculated based on a linear combination of one or more variance values), a percent-variance (e.g., calculated based on a combination of one or more variance values that each are a percent of variance from a target range of values for a respective action parameter), a skill level (e.g., "novice," "intermediate," or "expert," which may be determined based on predetermined ranges of variance values), any other suitable representation of the current skill level, or any combination thereof.

In particular embodiments, the athletic-performance model may include information regarding one or more target ranges of action-parameter values for the user performing actions of the action-type. System 160 may calculate one or more target ranges of action-parameter values for one or more action parameters based on the athletic-performance model. System 160 may calculate each target range based on a measure of probability with respect to the particular action parameters and the outcome data. For example, system 160 may calculate target ranges of values of one or more action parameters of the action-type such that if the user performs an action with action-parameter values in the target ranges, there is a high probability of a particular outcome. If the user is performing actions that yield action-parameter values that are in the target ranges, the user may be more tolerant to error. For example, if an external force (e.g., wind or another player nudging the user) interferes with the user performing an action, if he is performing an action such that action-parameter values may be determined within the target ranges, it may be more probable that the user will still have a positive outcome for that action despite the interference. System 160 may determine target ranges of values for one or more of the action parameters of the action-type. For example, system 160 may determine that certain action parameters may have a greater impact on the outcome data and thus determine target ranges only for those more influential action parameters.

At step 640, system 160 may receive from one or more sensors 120, biomechanical data of the user performing one or more additional actions (i.e., a first action) of the action-type and outcome data of an outcome corresponding to the additional actions. These additional actions may be actions performed after the actions whose biomechanical data is received in step 610. The biomechanical data of the additional actions may be received from the sensors 120 in real-time or post-processing. At step 650, system 160 may determine an additional set of action-parameter values for the additional actions based on the received biomechanical data for the additional actions. The additional set of action-parameter values may be determined similarly to the plurality of sets of action-parameter values are determined at step 620.

At step 660, system 160 may dynamically update the athletic-performance model based on the additional set of action-parameter values determined at step 640. In particular embodiments, system 160 may dynamically update the athletic-performance model by comparing the additional set of action-parameter values determined at step 640 to the plurality of sets of action-parameter values determined at step 620. In particular embodiments, system 160 may determine an updated current skill level of the user as part of dynamically updating the athletic-performance model. For example, system 160 may determine an updated current skill level of the user based one or more measures of variance computed with respect to the plurality of sets of action-parameter values determined at step 620 and the additional set of action-parameter values.

In particular embodiments, system 160 may generate a report of athletic-performance feedback for the user based on the updated athletic-performance model generated at step 660. The system may generate the report further based on a comparison of the athletic-performance model to the updated athletic-performance model.

Particular embodiments may repeat one or more steps of the method of FIG. 6, where appropriate. Although this disclosure describes and illustrates particular steps of the method of FIG. 6 as occurring in a particular order, this disclosure contemplates any suitable steps of the method of FIG. 6 occurring in any suitable order. Moreover, although this disclosure describes and illustrates an example method for generating and updating an athletic-performance model of a user, including the particular steps of the method of FIG. 6, this disclosure contemplates any suitable method for generating and updating an athletic-performance model of a user, including any suitable steps, which may include all, some, or none of the steps of the method of FIG. 6, where appropriate. Furthermore, although this disclosure describes and illustrates particular components, devices, or systems carrying out particular steps of the method of FIG. 6, this disclosure contemplates any suitable combination of any suitable components, devices, or systems carrying out any suitable steps of the method of FIG. 6.

Figure 7:
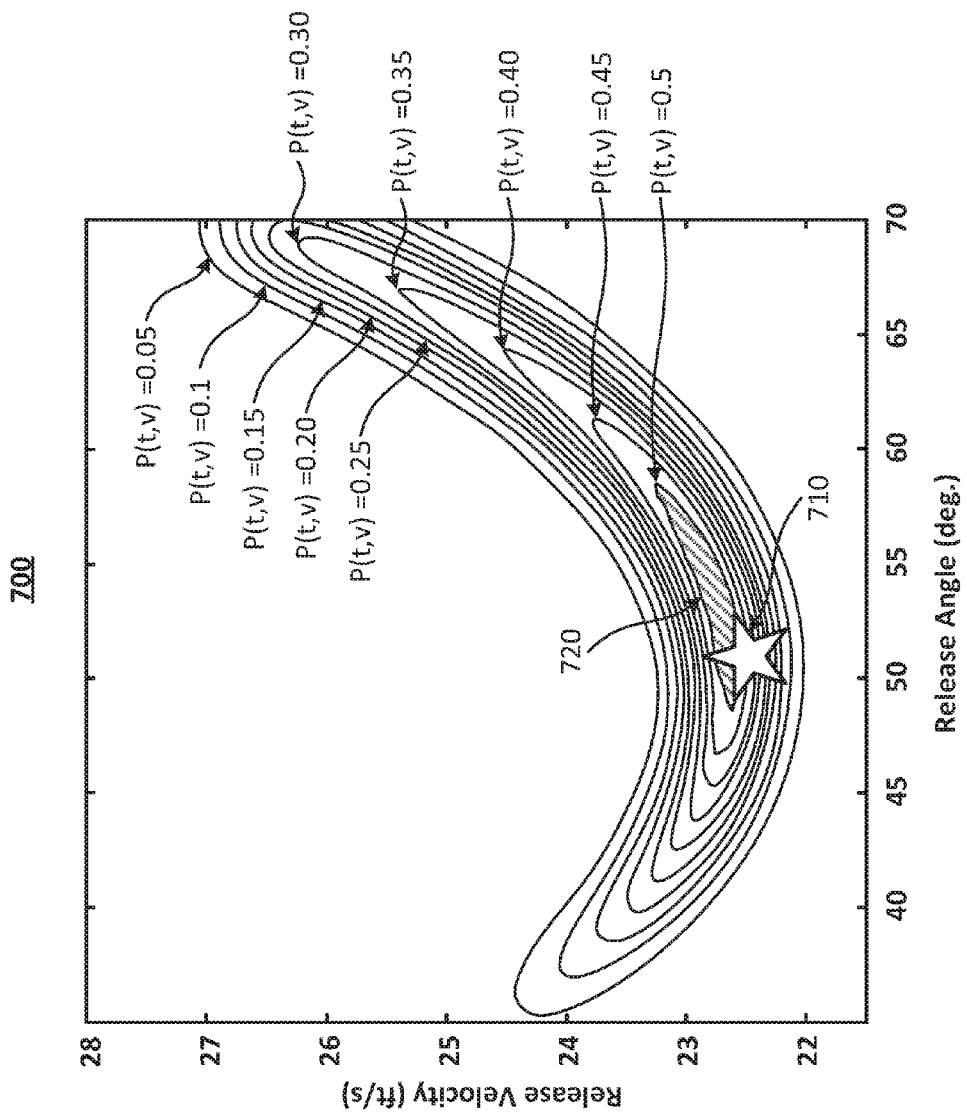
FIG. 7 illustrates an example plot based on an athletic-performance model.

FIG. 7 illustrates an example plot 700 based on an athletic-performance model. Plot 700 is depicted as being based on an athletic-performance model of a user performing a plurality of actions of a basketball free-throw action-type. It will be understood, however, that this is by way of illustration, not by way of limitation, and plot 700 may be created based on an athletic-performance model of the user performing a plurality of actions of any suitable action-type. Plot 700 is depicted as a two-dimensional rendering of an n-dimensional athletic-performance model, where each of the n dimensions corresponds to an action parameter, and where n denotes a positive integer. Plot 700 is with release velocity (v) on the vertical axis and release angle (t) on the horizontal axis. It will be understood, however, that this is by way of illustration, not by way of limitation, and plot 700 may be an n-dimensional plot, and each of the n dimensions may correspond to an action parameter of any suitable action-type, where n denotes a positive integer. Plot 700 is depicted as having probability contours, where each probability contour represents a likelihood of a particular outcome for particular sets of action-parameter values (e.g., release velocity and release angle). It will be understood that although plot 700 shows two action-parameter values, the probabilities (i.e., represented by probability contours in plot 700) may be computed based on the n dimensions of the athletic-performance model. Plot 700 may have any suitable number of probability contours, each corresponding to any suitable probability of a particular outcome.

Plot 700 includes a target area 720, which may be defined based on a probability contour representing a high likelihood of a particular outcome for particular sets of action-parameter values. In the illustrated embodiment of FIG. 7, plot 700 shows values of two example action parameters (i.e., release velocity and release angle) of the plurality of action-parameter values characterizing an action of the basketball free-throw action-type (i.e., an action of the basketball free-throw action-type is partially characterized by the plotted action parameters of plot 700). In the illustrated example of FIG. 7, target area 720 is shown as an area, the boundaries of which are defined by a probability contour connected to a fifty percent chance of a particular outcome (P(t, v)=0.5), where t denotes release angle (theta), v denotes release velocity, and P(t, v) denotes the probability of a positive outcome given t and v). The one or more target ranges of action parameters may be determined based on target area 720. For example, system 160 may determine a range of values of release velocity and a range of values of release angle that place the user's action within target area 720. Target area 720 may represent the particular combinations of action-parameter values for which the user, at his current skill level, has a high probability of a positive outcome (e.g., making a basketball shot). Target area 720 may be an area in which the combinations of action-parameter values are more tolerant to error (i.e., variability with respect to external parameters) according to the athletic-performance model.

Plot 700 is also depicted as including a performance marker 720, which may be based on a statistical description of the plurality of sets of action-parameter values of the user. For example, performance marker 720 may indicate an average (e.g., mean or median) of each of the plotted action-parameter values (i.e., the user's current average performance of an action of the action-type). Ideally, as the user improves his technique (i.e., performs actions based on which action-parameter values within the target ranges are determined), plot 700 may be updated (e.g., based on an updated performance model like that determined in step 660 of FIG. 6), and the performance marker 710 may be located at a position closer to or inside of target area 720. The closer performance marker 710 is to target area 720, the more error tolerant an action performed by the user may be.

In particular embodiments, plot 700 may be dynamically updated when the user's current skill level is updated for the action-type being evaluated. In particular embodiments, plot 700 may be dynamically updated when the user improves his technique (e.g., performs actions that yield action-parameter values closer or within the target ranges). For example, plot 700 may be redrawn based on an updated athletic-performance model for the user (e.g., like that determined in step 660 of FIG. 6). An updated plot 700 may include, for example, dynamically adjusted probability contours that reflect improved variance values for the user (i.e., improved current skill level). An updated plot 700 may include, for example, a dynamically adjusted position of performance marker 710 to a position closer to or within target area 720, which reflects improved biomechanical data of the user (i.e., performed actions yielding better action-parameter values with respect to target area 720). Thus, the user may aim to improve his (1) biomechanical performance, which moves the performance marker 710 in plot 700, and his (2) skill level (i.e., consistency), which moves the probability contours in plot 700. System 160 may generate a report of athletic-performance feedback to assist the user in improving his performance of actions of the action-type.

Although this disclosure describes and illustrates particular embodiments of FIG. 7 as being implemented by system 160, this disclosure contemplates any suitable embodiments of FIG. 7 as being implemented by any suitable platform or system. As an example, particular embodiments of FIG. 7 may be implemented by client system 130. Furthermore, although this disclosure describes and illustrates particular components, devices, or systems carrying out particular steps of the method of FIG. 7, this disclosure contemplates any suitable combination of any suitable components, devices, or systems carrying out any suitable steps of the method of FIG. 7.

Reports of Athletic-Performance Feedback

Figure 8A:
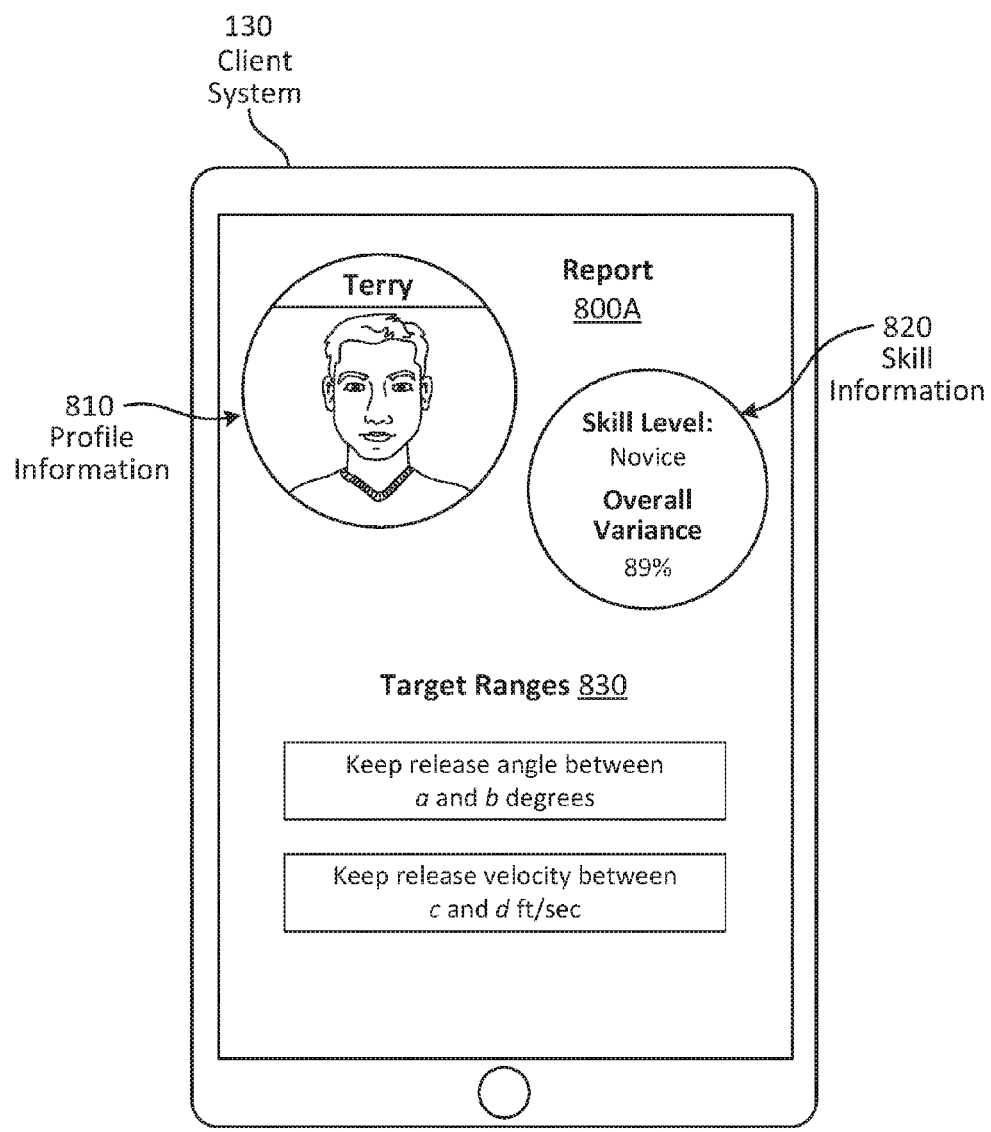
FIG. 8A illustrates an example report displayed on an interface of a client system.
Figure 8B:
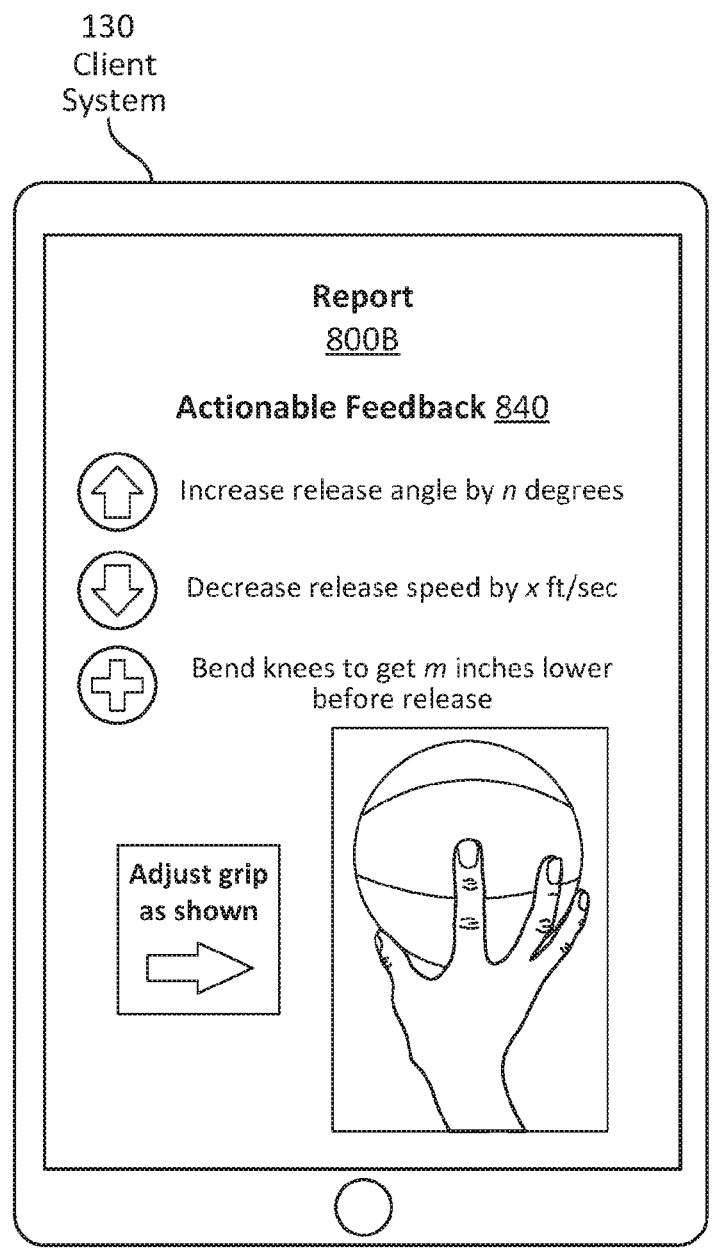
FIG. 8B illustrates an example report displayed on an interface of a client system.

FIG. 8A illustrates an example report 800A displayed on an interface of a client system 130. FIG. 8B illustrates an example report 800B displayed on an interface of a client system. Reports 800A and 800B may be collectively referred to herein as report 800. Report 800 may be generated based on an athletic-performance model for the user. For example, system 160 may generate report 800 by accessing the updated athletic-performance model of the user generated at step 660 of FIG. 6. Report 800 may be communicated to the user in any suitable format via any suitable interface, including, for example, being displayed by an application 140 running on client system 130 of the user. Report 800 may be dynamically generated or updated every time the user accesses an application 140 associated with system 160. Report 800 may be generated and delivered to the user periodically (e.g., via email or application 140), where the period for delivery may be set based on user preferences or automatically set as any suitable default period (e.g., weekly, monthly, or quarterly, or after a predetermined number of actions of the action-type have been performed by the user).

Report 800A is depicted as including profile information 810. Profile information 810 may include any suitable biographical information of a user, including, for example, name (e.g., Terry), profile picture (e.g., uploaded by the user or imported from a social-networking system with permission of the user), physical attributes (e.g., height and weight), information associated with the action-type the user is performing (e.g., basketball shots), any other suitable profile information about the user, or any combination thereof. Report 800A may include skill information 820, including, for example, a skill level categorization (e.g., novice, intermediate, or expert), a variance measure (e.g., a percentage determined based on one or more measures of variance of action-parameter values of the user performing actions of the action-type), any other suitable skill information, or any combination thereof. Report 800A may additionally include target ranges 830. Target ranges 830 may include one or more target ranges of values of action parameters of the action-type. Target ranges 830 may be determined, for example, based on the athletic-performance model of the user. Target ranges 830 may be determined based on values of action parameters of the action-type that correspond to a high probability of a positive outcome of an action of the action-type. In the illustrated example, target ranges 830 are shown for a basketball-shot action-type and include a first instruction to keep release angle between a and b degrees, where a and b denote positive real numbers and a second instruction to keep release velocity between c and d ft/sec, where c and d denote positive real numbers. It will be understood that these target ranges 830 are merely illustrative, not by way of limitation, and there may be any suitable number of target ranges 830 for any suitable number of action parameters for any suitable action-type. In particular embodiments, the report may include trend information of the user. The trend information may be determined, for example, based on an analysis of the plurality of sets of action-parameter values of the user over time. Trend information may be presented, for example, by a graphical representation depicting the values of a particular action parameter of the user over a predetermined period of time.

Athletic-performance feedback may be customized for a particular user, including, for example, based on a user's hand size, finger length, age, gender, or any other suitable user information. Feedback may also include cognitive metrics, including, for example, assessment of user's performance under different stresses and in different performance scenarios (e.g., based on biomechanical data recorded at big game versus recorded in practice). Athletic-performance feedback may additionally include team dynamics information, including, for example, awareness with respect to positioning of other players in a game scenario (e.g., based eye or head position determined based on biomechanical data from a POV camera sensor 120A).

Report 800B may include actionable feedback 840. System 160 may generate actionable feedback 840 based on the athletic-performance model of the user. System 160 may correlate the action-parameter values determined for the user (e.g., represented by performance marker 710 in plot 700) to corrective actions, which may be delivered to the user as actionable feedback 840. System 160 may determine information associated with one or more biomechanical acts of the user that are associated with the plurality of actions of the action-type. System 160 may then determine, based on the athletic-performance model and the information associated with the one or more biomechanical acts of the user, one or more suggested modifications to one or more of the biomechanical acts. System 160 may then provide, as actionable feedback 840, the suggested modifications of the biomechanical acts. Actionable feedback 840 may include one or more suggested modifications to one or more biomechanical acts (e.g., bending knees more) that, if implemented by the user, may will result in improved action-parameter values or in improved consistency (e.g., less variance) across action-parameter values. For example, for a basketball free-throw action-type, system 160 may determine that the user pulls his index finger away from shot plane 240 during release of the basketball 260, which may be reflected by values of a finger position 230 action parameter determined by system 160. System 160 may then provide a corrective action (e.g., keep index finger in line with shot plane 240) to the user as actionable feedback 840. In another example, for a basketball free-throw action-type, system 160 may determine that the user spaces his fingers incorrectly (e.g., less than 2.8 inches apart), and the system may provide feedback to the user instructing him to work on his finger placement. In the illustrated example of FIG. 8B, actionable feedback 840 is shown as including three textual instructions: (1) increase release angle by n degrees, (2) decrease release speed by x ft/sec, and (3) bend knees to get m inches lower before release, where n, x, and m denote positive real numbers. Actionable feedback 840 is also depicted as including an image of a hand positioned correctly on a basketball 260, with optimal finger position 230 and finger spacing 220, accompanied by an instruction to adjust grip as shown in the image.

Actionable feedback 840 may be communicated to the user in such a way as to facilitate self-correction when performing the particular athletic action. The athletic-performance feedback of report 800 may be dynamically communicated to the user in real-time, for example, by one or more sensors 120. The one or more sensors 120 may, in response to receiving instructions from system 160, provide audible, tactile, visual, or other suitable feedback to signal to the user that a suggested modification a biomechanical act of the user is recommended. For example, a wrist-mounted sensor may vibrate to alert the user to look at a display screen of the wrist-mounted sensor, and the display screen may display a message instructing the user to adjust the follow-through angle of his wrist when performing an action of a basketball free-throw action-type. As another example, athletic-performance feedback may be delivered to the user via an optical head-mounted display (e.g., GOOGLE GLASS®). For a basketball free-throw action-type, the optical head-mounted display may present to the user a visual depiction of the actual trajectory of the basketball, as propelled by the user, and a visual depiction of an ideal trajectory of the basketball, which the user could achieve if he makes the one or more suggested modifications of biomechanical acts. As another example, athletic-performance feedback may be delivered to the user via an avatar (e.g., modelled after the user or a professional athlete) shown on client system 130, an optical head-mounted display, or any other suitable display. The avatar may be illustrated to show the biomechanical acts performed by the user and the one or more suggested modifications of biomechanical acts. Biomechanical acts may be ranked based on importance (e.g., effect on a probability of a particular outcome) to performance of an action of the action-type. In particular embodiments, system 160 may select only the actionable feedback 840 based on a predetermined number of the highest ranked biomechanical acts to communicate to the user as actionable feedback 840 (e.g., feedback may include prioritized instructions to modify biomechanical acts based on importance).

Report 800 may include athletic-performance feedback that is generated based on a comparison of the user's athletic-performance model to an updated athletic-performance model of the user. Report 800 may also include athletic-performance feedback that is generated based on a comparison of the athletic-performance model of the user (i.e., a first user) to an athletic-performance model of a second user (e.g., a professional athlete or top-performer for the action-type). Athletic-performance feedback may be tailored to the first user's preferences. For example, the first user may specify in settings that he wishes his athletic-performance feedback to be based on a particular second user (e.g., a favorite professional athlete) so that the first user may work to conform his action-parameter values to those of the selected second user. In particular embodiments, system 160 may generate an athletic-performance model for a second user. The athletic-performance model of the second user may be generated based on a plurality of sets of action-parameter values of the second user, where the plurality of sets of action-parameter values of the second user are determined based on biomechanical data of the second user performing a plurality of actions of the action-type and outcome data of a plurality of outcomes corresponding to the respective plurality of actions. System 160 may store biographical data, biomechanical data, outcome data, action-parameter data, any other suitable athletic-performance model data, and any other data associated with the respective second user for a plurality of second users in one or more databases. System 160 may use the athletic-performance model of the selected second user to generate athletic-performance feedback for the first user. For example, system 160 may generate a report of athletic-performance feedback for the first user based on a comparison of an athletic-performance model of the first user to the athletic-performance model of the second user. In this example, system 160 may compare the plurality of sets of action-parameter values of the first user to the plurality of sets of action-parameter values of the second user. System 160 may then generate athletic-performance feedback (e.g., a suggested modification of a biomechanical act) that includes one or more instructions customized to conforming one or more athletic-performance values, one or more biomechanical acts, or any combination thereof, to the respective value or act of the second user.

Although this disclosure describes and illustrates particular embodiments of FIGS. 8A-8B as being implemented by system 160, this disclosure contemplates any suitable embodiments of FIGS. 8A-8B as being implemented by any suitable platform or system. As an example, particular embodiments of FIGS. 8A-8B may be implemented by client system 130. Furthermore, although this disclosure describes and illustrates particular components, devices, or systems carrying out particular steps of the method of FIGS.

8A-8B, this disclosure contemplates any suitable combination of any suitable components, devices, or systems carrying out any suitable steps of the method of FIGS. 8A-8B.

Method Flowcharts

Figure 9:
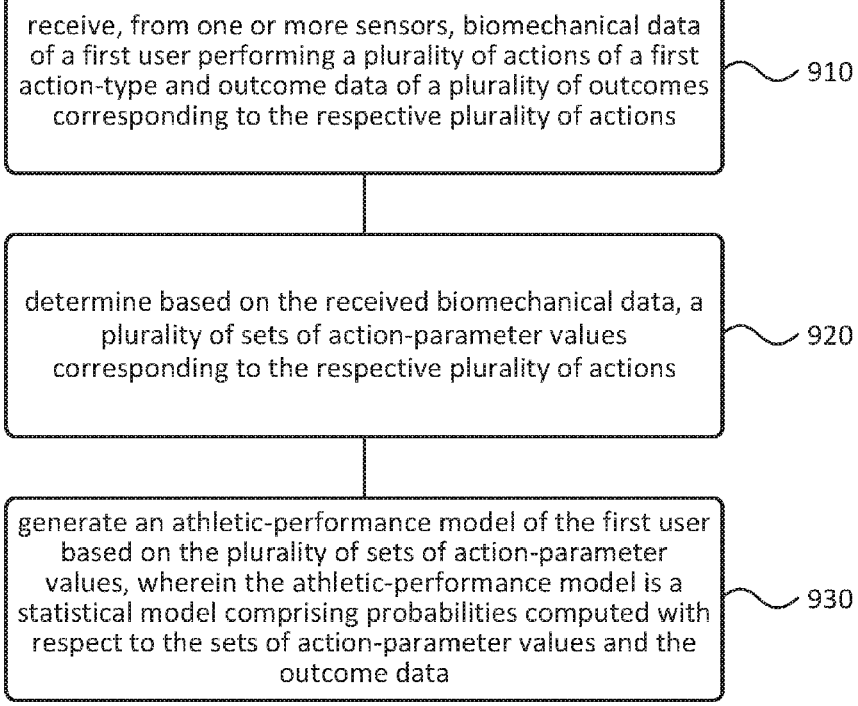
FIG. 9 is a flowchart illustrating an example method for generating an athletic-performance model of a first user.

FIG. 9 is a flowchart illustrating an example method for generating an athletic-performance model of a first user. The method may begin at step 910, where biomechanical data of a first user performing a plurality of actions of a first action-type and outcome data of a plurality of outcomes corresponding to the respective plurality of actions are received from one or more sensors. At step 920, a plurality of sets of action-parameter values corresponding to the respective plurality of actions are determined based on the received biomechanical data. At step 930, an athletic-performance model of the first user is generated based on the plurality of sets of action-parameter values, wherein the athletic-performance model is a statistical model including probabilities computed with respect to the sets of action-parameter values and the outcome data.

Particular embodiments may repeat one or more steps of the method of FIG. 9, where appropriate. Although this disclosure describes and illustrates particular steps of the method of FIG. 9 as occurring in a particular order, this disclosure contemplates any suitable steps of the method of FIG. 9 occurring in any suitable order. Moreover, although this disclosure describes and illustrates an example method for generating an athletic-performance model of a first user, including the particular steps of the method of FIG. 9, this disclosure contemplates any suitable method for generating an athletic-performance model of a first user, including any suitable steps, which may include all, some, or none of the steps of the method of FIG. 9, where appropriate. Furthermore, although this disclosure describes and illustrates particular components, devices, or systems carrying out particular steps of the method of FIG. 9, this disclosure contemplates any suitable combination of any suitable components, devices, or systems carrying out any suitable steps of the method of FIG. 9.

Figure 10:
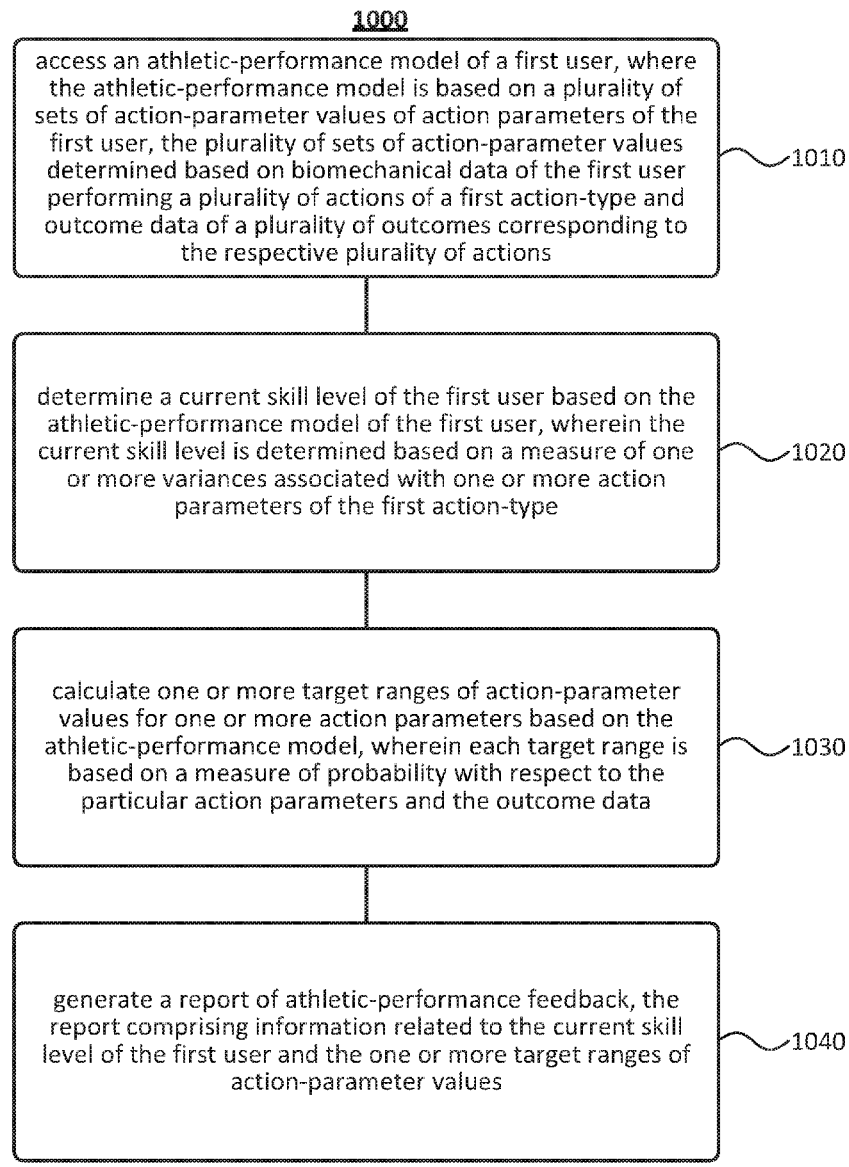
FIG. 10 is a flowchart illustrating an example method for generating a report of athletic-performance feedback.

FIG. 10 is a flowchart illustrating an example method for generating a report of athletic-performance feedback. The method may being at step 1010, where an athletic-performance model of a first user is accessed, where the athletic-performance model is based on a plurality of sets of action-parameter values of action parameters of the first user, and the plurality of sets of action-parameter values are determined based on biomechanical data of the first user performing a plurality of actions of a first action-type and outcome data of a plurality of outcomes corresponding to the respective plurality of actions. At step 1020, a current skill level of the first user is determined based on the athletic-performance model of the first user, where the current skill level is determined based on a measure of one or more variances associated with one or more action parameters of the first action-type. At step 1030, one or more target ranges of action-parameter values for one or more action parameters are calculated based on the athletic-performance model, where each target range is based on a measure of probability with respect to the particular action parameters and the outcome data. At step 1030, a report of athletic-performance feedback is generated, and the report includes information related to the current skill level of the first user and the one or more target ranges of action-parameter values.

Particular embodiments may repeat one or more steps of the method of FIG. 10, where appropriate. Although this disclosure describes and illustrates particular steps of the method of FIG. 10 as occurring in a particular order, this disclosure contemplates any suitable steps of the method of FIG. 10 occurring in any suitable order. Moreover, although this disclosure describes and illustrates an example method for generating a report of athletic-performance feedback, including the particular steps of the method of FIG. 10, this disclosure contemplates any suitable method for generating a report of athletic-performance feedback, including any suitable steps, which may include all, some, or none of the steps of the method of FIG. 10, where appropriate. Furthermore, although this disclosure describes and illustrates particular components, devices, or systems carrying out particular steps of the method of FIG. 10, this disclosure contemplates any suitable combination of any suitable components, devices, or systems carrying out any suitable steps of the method of FIG. 10.

Figure 11:
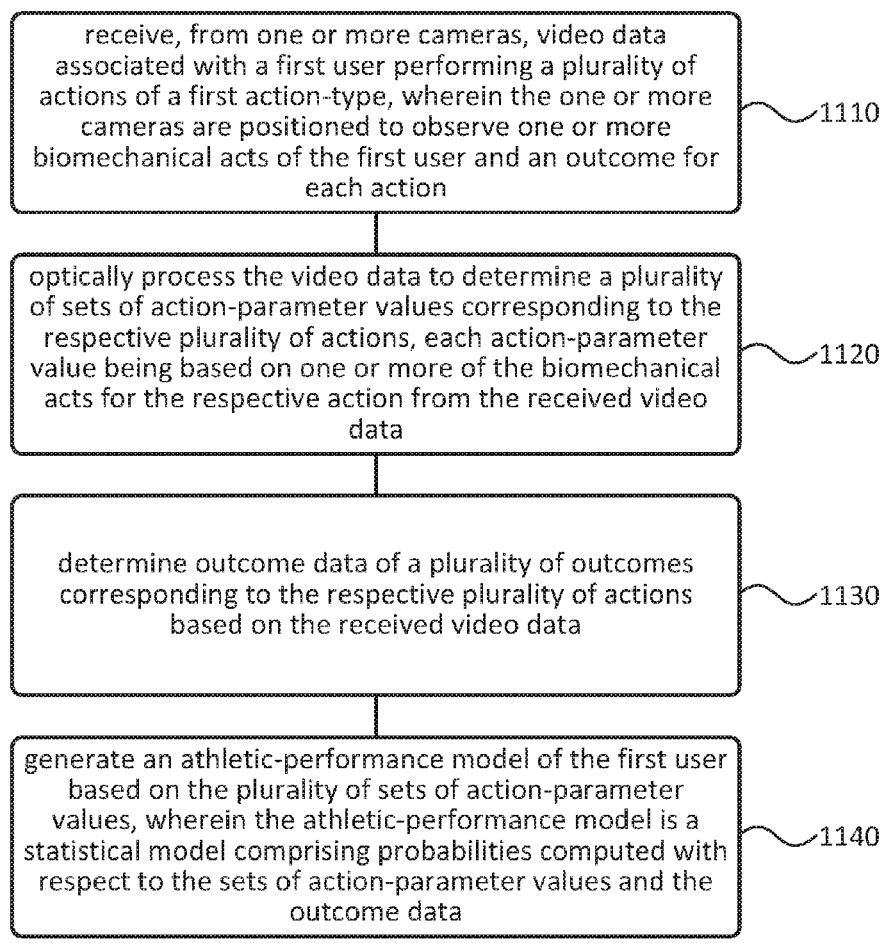
FIG. 11 is a flowchart illustrating an example method for generating an athletic-performance model of a first user based on video data.

FIG. 11 is a flowchart illustrating an example method for generating an athletic-performance model of a first user based on video data. The method may begin at step 1110, where video data associated with a first user performing a plurality of actions of a first action-type is received from one or more cameras, where the one or more cameras are positioned to observe one or more biomechanical acts of the first user and an outcome for each action. At step 1120, the received video data may be optically processed to determine a plurality of sets of action-parameter values corresponding to the respective plurality of actions, each action-parameter value being based on one or more of the biomechanical acts for the respective action from the received video data. At step 1130, outcome data of a plurality of outcomes corresponding to the respective plurality of actions is determined based on the received video data. At step 1140, an athletic-performance model of the first user is generated based on the plurality of sets of action-parameter values, where the athletic-performance model is a statistical model including probabilities computed with respect to the sets of action-parameter values and the outcome data.

Particular embodiments may repeat one or more steps of the method of FIG. 11, where appropriate. Although this disclosure describes and illustrates particular steps of the method of FIG. 11 as occurring in a particular order, this disclosure contemplates any suitable steps of the method of FIG. 11 occurring in any suitable order. Moreover, although this disclosure describes and illustrates an example method for generating an athletic-performance model of a first user based on video data, including the particular steps of the method of FIG. 11, this disclosure contemplates any suitable method for generating an athletic-performance model of a first user based on video data, including any suitable steps, which may include all, some, or none of the steps of the method of FIG. 11, where appropriate. Furthermore, although this disclosure describes and illustrates particular components, devices, or systems carrying out particular steps of the method of FIG. 11, this disclosure contemplates any suitable combination of any suitable components, devices, or systems carrying out any suitable steps of the method of FIG. 11.

Systems and Methods

Figure 12:
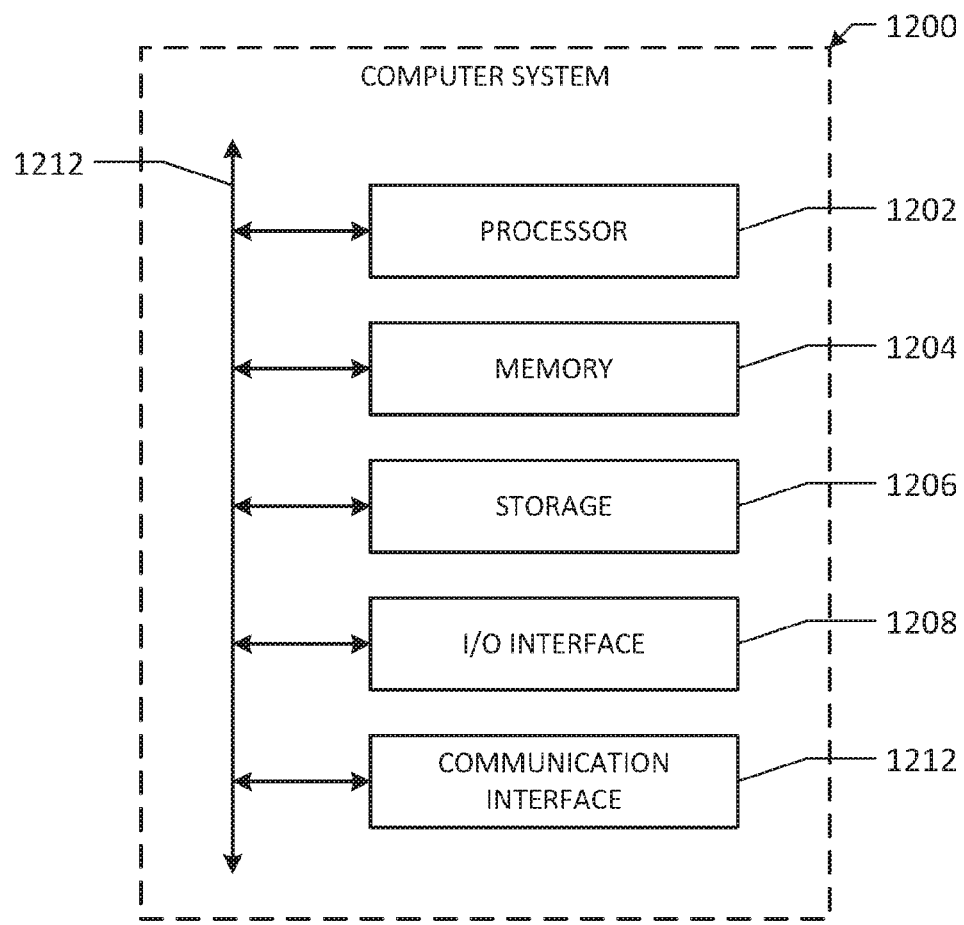
FIG. 12 illustrates an example computer system.

FIG. 12 illustrates an example computer system 1200. In particular embodiments, one or more computer systems 1200 perform one or more steps of one or more methods described or illustrated herein. In particular embodiments, one or more computer systems 1200 provide functionality described or illustrated herein. In particular embodiments, software running on one or more computer systems 1200 performs one or more steps of one or more methods described or illustrated herein or provides functionality described or illustrated herein. Particular embodiments include one or more portions of one or more computer systems 1200. Herein, reference to a computer system may encompass a computing device, and vice versa, where appropriate. Moreover, reference to a computer system may encompass one or more computer systems, where appropriate.

This disclosure contemplates any suitable number of computer systems 1200. This disclosure contemplates computer system 1200 taking any suitable physical form. As example, computer system 1200 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 1200 may include one or more computer systems 1200; be unitary or distributed; span multiple locations; span multiple machines; span multiple data centers; or reside in a cloud, which may include one or more cloud components in one or more networks. Where appropriate, one or more computer systems 1200 may perform without substantial spatial or temporal limitation one or more steps of one or more methods described or illustrated herein. As an example, one or more computer systems 1200 may perform in real time or in batch mode one or more steps of one or more methods described or illustrated herein. One or more computer systems 1200 may perform at different times or at different locations one or more steps of one or more methods described or illustrated herein, where appropriate.

In particular embodiments, computer system 1200 includes a processor 1202, memory 1204, storage 1206, an input/output (I/O) interface 1208, a communication interface 1210, and a bus 1212. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1202 includes hardware for executing instructions, such as those making up a computer program. As an example, to execute instructions, processor 1202 may retrieve (or fetch) the instructions from an internal register, an internal cache, memory 1204, or storage 1206; decode and execute them; and then write one or more results to an internal register, an internal cache, memory 1204, or storage 1206. In particular embodiments, processor 1202 may include one or more internal caches for data, instructions, or addresses. This disclosure contemplates processor 1202 including any suitable number of any suitable internal caches, where appropriate. As an example, processor 1202 may include one or more instruction caches, one or more data caches, and one or more translation lookaside buffers (TLBs). Instructions in the instruction caches may be copies of instructions in memory 1204 or storage 1206, and the instruction caches may speed up retrieval of those instructions by processor 1202. Data in the data caches may be copies of data in memory 1204 or storage 1206 for instructions executing at processor 1202 to operate on; the results of previous instructions executed at processor 1202 for access by subsequent instructions executing at processor 1202 or for writing to memory 1204 or storage 1206; or other suitable data. The data caches may speed up read or write operations by processor 1202. The TLBs may speed up virtual-address translation for processor 1202. In particular embodiments, processor 1202 may include one or more internal registers for data, instructions, or addresses. This disclosure contemplates processor 1202 including any suitable number of any suitable internal registers, where appropriate. Where appropriate, processor 1202 may include one or more arithmetic logic units (ALUs); be a multi-core processor; or include one or more processors 1202. Although this disclosure describes and illustrates a particular processor, this disclosure contemplates any suitable processor.

In particular embodiments, memory 1204 includes main memory for storing instructions for processor 1202 to execute or data for processor 1202 to operate on. As an example, computer system 1200 may load instructions from storage 1206 or another source (such as, for example, another computer system 1200) to memory 1204. Processor 1202 may then load the instructions from memory 1204 to an internal register or internal cache. To execute the instructions, processor 1202 may retrieve the instructions from the internal register or internal cache and decode them. During or after execution of the instructions, processor 1202 may write one or more results (which may be intermediate or final results) to the internal register or internal cache. Processor 1202 may then write one or more of those results to memory 1204. In particular embodiments, processor 1202 executes only instructions in one or more internal registers or internal caches or in memory 1204 (as opposed to storage 1206 or elsewhere) and operates only on data in one or more internal registers or internal caches or in memory 1204 (as opposed to storage 1206 or elsewhere). One or more memory buses (which may each include an address bus and a data bus) may couple processor 1202 to memory 1204. Bus 1212 may include one or more memory buses, as described below. In particular embodiments, one or more memory management units (MMUs) reside between processor 1202 and memory 1204 and facilitate accesses to memory 1204 requested by processor 1202. In particular embodiments, memory 1204 includes random access memory (RAM). This RAM may be volatile memory, where appropriate Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1204 may include one or more memories 1204, where appropriate. Although this disclosure describes and illustrates particular memory, this disclosure contemplates any suitable memory.

In particular embodiments, storage 1206 includes mass storage for data or instructions. As an example, storage 1206 may include a hard disk drive (HDD), a floppy disk drive, flash memory, an optical disc, a magneto-optical disc, magnetic tape, or a Universal Serial Bus (USB) drive or a combination of two or more of these. Storage 1206 may include removable or non-removable (or fixed) media, where appropriate. Storage 1206 may be internal or external to computer system 1200, where appropriate. In particular embodiments, storage 1206 is non-volatile, solid-state memory. In particular embodiments, storage 1206 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1206 taking any suitable physical form. Storage 1206 may include one or more storage control units facilitating communication between processor 1202 and storage 1206, where appropriate. Where appropriate, storage 1206 may include one or more storages 1206. Although this disclosure describes and illustrates particular storage, this disclosure contemplates any suitable storage.

In particular embodiments, I/O interface 1208 includes hardware, software, or both, providing one or more interfaces for communication between computer system 1200 and one or more I/O devices. Computer system 1200 may include one or more of these I/O devices, where appropriate. One or more of these I/O devices may enable communication between a person and computer system 1200. As an example, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1208 for them. Where appropriate, I/O interface 1208 may include one or more device or software drivers enabling processor 1202 to drive one or more of these I/O devices. I/O interface 1208 may include one or more I/O interfaces 1208, where appropriate. Although this disclosure describes and illustrates a particular I/O interface, this disclosure contemplates any suitable I/O interface.

In particular embodiments, communication interface 1210 includes hardware, software, or both providing one or more interfaces for communication (such as, for example, packet-based communication) between computer system 1200 and one or more other computer systems 1200 or one or more networks. As an example, communication interface 1210 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1210 for it. As an example, computer system 1200 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1200 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1200 may include any suitable communication interface 1210 for any of these networks, where appropriate. Communication interface 1210 may include one or more communication interfaces 1210, where appropriate. Although this disclosure describes and illustrates a particular communication interface, this disclosure contemplates any suitable communication interface.

In particular embodiments, bus 1212 includes hardware, software, or both coupling components of computer system 1200 to each other. As an example, bus 1212 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1212 may include one or more buses 1212, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising, by one or more computing devices:
   accessing a first athletic-performance model of a first user, wherein:
   the first athletic-performance model is generated based on a first plurality of sets of action-parameter values of a plurality of action parameters and on a first plurality of outcomes of the first user, each of the first plurality of sets of action-parameter values being associated with a respective outcome of the first plurality of outcomes, the first plurality of sets of action-parameter values are determined based on biomechanical data of the first user performing a first plurality of actions of a first action-type, the first plurality of outcomes correspond respectively to the first plurality of actions, and the biomechanical data of the first user is received from one or more sensors comprising a first sensor, the first sensor being positioned on the first user to detect the biomechanical data of the first user while the first user is performing the first plurality of actions of the first action-type;

determining a current skill level of the first user based on the first athletic-performance model of the first user, wherein the current skill level is determined based on a measure of one or more variances associated with one or more action parameters of the plurality of action parameters;

computing one or more target ranges of action-parameter values for one or more selected action parameters of the plurality of action parameters based on the first athletic-performance model, wherein each target range is computed for the first user based on an analysis of the first plurality of sets of action-parameter values and of the respective first plurality of outcomes of the first user; and generating a report of athletic-performance feedback, the report comprising information related to the current skill level of the first user and the one or more target ranges of action-parameter values.

2. The method of claim 1, wherein the report comprises trend information of the first user, the trend information being determined based on the analysis of the first plurality of sets of action-parameter values.

3. The method of claim 1, wherein the report comprises at least one suggested modification of a biomechanical act of the first user, the biomechanical act being associated with the first user performing an action of the first action-type.

4. The method of claim 3, wherein the at least one suggested modification of the biomechanical act of the first user is based on a comparison between the first athletic-performance model of the first user and a second athletic-performance model of a second user.

5. The method of claim 4, wherein the second athletic-performance model of the second user is generated based on a second plurality of sets of action-parameter values of the plurality of action parameters and on a second plurality of outcomes of the second user, the second plurality of sets of action-parameter values being determined based on biomechanical data of the second user performing a second plurality of actions of the first action-type, and the second plurality of outcomes corresponding respectively to the second plurality of actions, wherein the second plurality of outcomes correspond to positive outcomes.

6. The method of claim 1, wherein the first action-type is a basketball shot.

7. The method of claim 6, wherein the plurality of action parameters comprise a release angle of a basketball, the basketball being used by the first user in performing an action of the first action-type.

8. The method of claim 7, wherein the plurality of action parameters comprise a release velocity of the basketball.

9. The method of claim 8, wherein the report of athletic-performance feedback comprises a target range of release angle values and a target range of release velocity values for the first user performing the action of the first action-type.

10. The method of claim 1, wherein determining the current skill level of the first user comprises calculating a measure of consistency for the first action-type for the first user, the measure of consistency being computed based on one or more variance values, each variance value being determined based on a respective plurality of action-parameter values of the first plurality of sets of action-parameter values, the respective plurality of action-parameter values corresponding to an action parameter of the plurality of action parameters.

11. The method of claim 1, further comprising sending the report to a client system of the first user for display to the first user.

12. The method of claim 1, wherein the first sensor comprises a wearable sensor.

13. One or more computer-readable non-transitory storage media embodying software that is operable when executed to:

access a first athletic-performance model of a first user, wherein:

the first athletic-performance model is generated based on a first plurality of sets of action-parameter values of a plurality of action parameters and on a first plurality of outcomes of the first user, each of the first plurality of sets of action-parameter values being associated with a respective outcome of the first plurality of outcomes, the first plurality of sets of action-parameter values are determined based on biomechanical data of the first user performing a first plurality of actions of a first action-type, the first plurality of outcomes correspond respectively to the first plurality of actions, and the biomechanical data of the first user is received from one or more sensors comprising a first sensor, the first sensor being positioned on the first user to detect the biomechanical data of the first user while the first user is performing the first plurality of actions of the first action-type;

determine a current skill level of the first user based on the first athletic-performance model, wherein the current skill level is determined based on a measure of one or more variances associated with one or more action parameters of the plurality of action parameters;

compute one or more target ranges of action-parameter values for one or more selected action parameters of the plurality of action parameters based on the first athletic-performance model, wherein each target range is computed for the first user based on an analysis of the first plurality of sets of action-parameter values of the first user and of the respective first plurality of outcomes of the first user; and generate a report of athletic-performance feedback, the report comprising information related to the current skill level of the first user and the one or more target ranges of action-parameter values.

14. The media of claim 13, wherein the report comprises trend information of the first user, the trend information being determined based on the analysis of the first plurality of sets of action-parameter values.

15. A system comprising: one or more processors; and a memory coupled to the one or more processors comprising instructions executable by the one or more processors, the one or more processors operable when executing the instructions to:

access a first athletic-performance model of a first user, wherein:
  the first athletic-performance model is generated based on a first plurality of sets of action-parameter values of a plurality of action parameters and on a first plurality of outcomes of the first user, each of the first plurality of sets of action-parameter values being associated with a respective outcome of the first plurality of outcomes,
  the first plurality of sets of action-parameter values are determined based on biomechanical data of the first user performing a first plurality of actions of a first action-type,
  the first plurality of outcomes correspond respectively to the first plurality of actions, and
  the biomechanical data of the first user is received from one or more sensors comprising a first sensor, the first sensor being positioned on the first user to detect the biomechanical data of the first user while the first user is performing the first plurality of actions of the first action-type;

determine a current skill level of the first user based on the first athletic-performance model, wherein the current skill level is determined based on a measure of one or more variances associated with one or more action parameters of the plurality of action parameters;

compute one or more target ranges of action-parameter values for one or more selected action parameters of the plurality of action parameters based on the first athletic-performance model, wherein each target range is computed for the first user based on an analysis of the first plurality of sets of action-parameter values of the first user and of the respective first plurality of outcomes of the first user; and generate a report of athletic-performance feedback, the report comprising information related to the current skill level of the first user and the one or more target ranges of action-parameter values.

16. The system of claim 15, wherein the report comprises trend information of the first user, the trend information being determined based on the analysis of the first plurality of sets of action-parameter values.

* * * * *